(12) United States Patent
Yoshida

(10) Patent No.: US 6,936,190 B2
(45) Date of Patent: Aug. 30, 2005

(54) ELECTRICALLY CONDUCTIVE ORGANIC COMPOUND AND ELECTRONIC DEVICE

(75) Inventor: Hiroaki Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 366 days.

(21) Appl. No.: 10/107,051

(22) Filed: Mar. 28, 2002

(65) Prior Publication Data

US 2003/0071259 A1 Apr. 17, 2003

(30) Foreign Application Priority Data

Oct. 15, 2001 (JP) .......................... 2001-317096

(51) Int. Cl.$^7$ .................... C08G 77/60; C08G 35/24; H01L 35/24; H01B 1/12
(52) U.S. Cl. ............... 252/511; 252/299.01; 252/299.3; 252/582; 549/4; 549/59; 257/40; 528/377
(58) Field of Search .............. 252/511, 299.3, 252/582, 589, 299.01; 549/4, 59; 257/40; 528/377; 428/1.1, 1.4; 438/151, 99

(56) References Cited

U.S. PATENT DOCUMENTS 6,048,928 A * 4/2000 Yu et al. ................. 525/35
6,107,117 A * 8/2000 Bao et al. ................. 438/99
6,265,243 B1 * 7/2001 Katz et al. ................. 438/99
2004/0002576 A1 * 1/2004 Oguma et al. ............. 528/4

FOREIGN PATENT DOCUMENTS

| JP | 62-085224 | | 4/1987 | |
| JP | 04-202434 | * | 7/1992 | ........... C08G/77/60 |
| JP | 08-334622 | * | 12/1996 | ........... G02B/5/30 |
| JP | 9-83040 | | 3/1997 | |
| JP | 09-083040 | * | 3/1997 | ........... H01L/51/00 |
| JP | 11-202104 | * | 7/1999 | ........... G02B/3/00 |
| JP | 2000-304914 | * | 11/2000 | ........... G02B/5/20 |

* cited by examiner

Primary Examiner—Yogendra N. Gupta
Assistant Examiner—Kallambella Vijayakumar
(74) Attorney, Agent, or Firm—Arent Fox PLLC

(57) ABSTRACT

In an electrically conductive organic compound, a side chain portion simultaneously exhibiting refractive index anisotropy and σ conjugated system electrical conductivity is bonded to a main chain portion exhibiting π conjugated system electrical conductivity. The electrically conductive organic compound is used in the production of a constituent element for electronic devices.

28 Claims, 12 Drawing Sheets

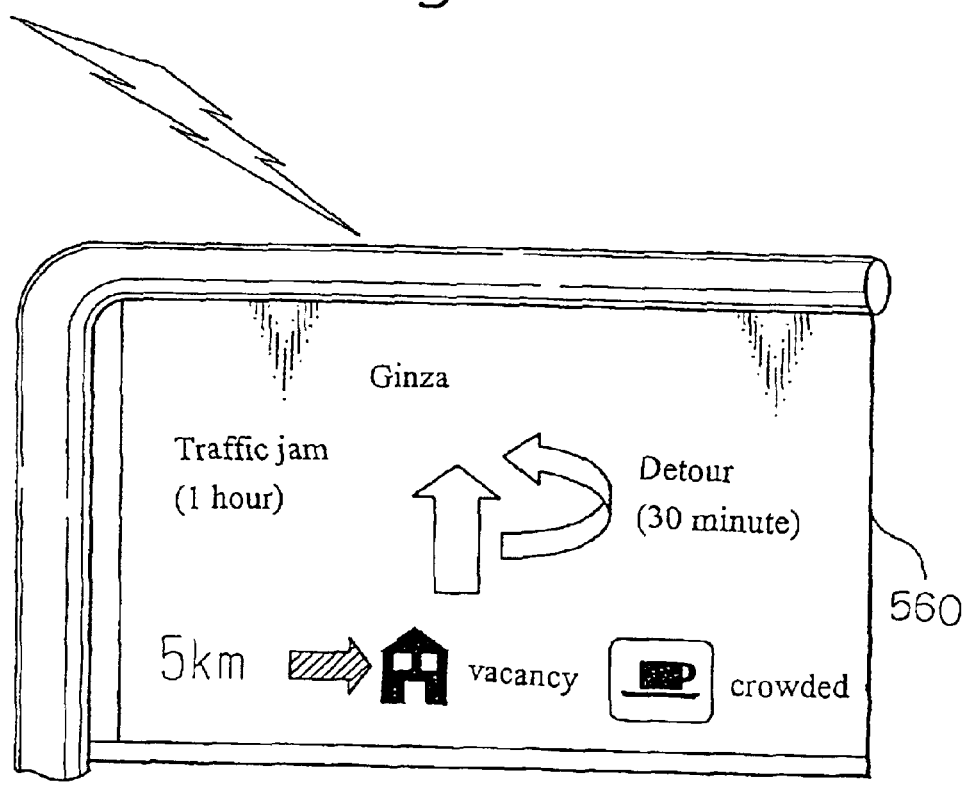

ELECTRICALLY CONDUCTIVE ORGANIC COMPOUND AND ELECTRONIC DEVICE

CROSS-REFERENCE TO RELATED APPLICATIONS

This application is based upon and claims a priority of Japanese Patent Application No. 2001-317096, filed Oct. 15, 2001, the contents being incorporated herein by reference.

BACKGROUND OF THE INVENTION

1. Field of the Invention

The present invention relates to an electrically conductive organic compound. More particularly, the present invention relates to an organic semiconductor that can be used for the production of electronic devices such as transistors and, specifically to an organic semiconductor that can be applied to flexible electronic devices such as electronic paper. The present invention also relates to an electronic device using such an organic semiconductor.

2. Description of Related Art

Performance of liquid crystal displays and organic EL displays has been drastically improved in recent years in the field of electronic displays, and a remarkable progress has been made in high precision and large scale displays. On the other hand, development of displays having an easy-to-see property and flexibility, or shape changeability by bending, and high portability, like the properties of paper as typified by so-called "electronic paper", has earnestly been required. To accomplish this electronic paper, it is essentially necessary to assemble a thin film transistor (TFT), etc, into a plastic substrate, that is, to accomplish a flexible pixel driving circuit. In existing electronic circuits mainly using polycrystalline silicon (poly-Si) and amorphous silicon (a-Si), however, large-scale processes such as those including application of high-temperature and high-vacuum processes are necessary, and therefore, the application of such a technology is limited to only a small percentage in the production of portable devices and has not yet spread widely, in view of insufficient heat resistance of the plastic substrate used and the production cost. To solve the problems, organic semiconductors that are excellent in flexibility, do not require the high-temperature vacuum process such as vacuum deposition and can be practiced by printing means at a low cost, have drawn increasing attention.

The film formation means of the organic semiconductors can be broadly divided into a group of a vacuum process such as vacuum deposition and a group using a solution such as a spin coating method, a casting method and a printing method. When the organic semiconductors are applied to devices such as field effect transistors, the vacuum deposition method providing high crystallinity of molecules has mainly been employed in the past to accomplish the highest possible carrier mobility. Typical organic semiconductors capable of forming films by the vacuum deposition method are oligothiophene (*Applied Physics Letters*, H. Akimichi et al, 58(14), Apr. 8, 1991), pentacene (*Applied Physics Letters*, C. D. Dimitrakopoulos et al, 80(4), Aug. 15, 1996), and copper phthalocyanine. On the other hand, typical organic semiconductors capable of forming films from the solution by the casting method, the spin coating method, or the printing method, are polythienylene vinylene (*Applied Physics Letters*, H. Fuchigami et al, 63(10), Sep. 6, 1993), and polyalkylthiophene (*Applied Physics Letters*, A. Tsumura et al, Vol. 149, P1210, 1986, and *Journal American Chemical Society*, Vol. 1117, p233, 1995). To discover new functions, examples of the film formation method by applying an LB (Langmuir-Blodgett) method for forming a monomolecular film and for controlling molecular orientation have also been reported (*Applied Physics Letters*, J. Paloheimo et al, 56(12), Mar. 19, 1990).

When the organic semiconductor described above is used for a channel layer of a field effect transistor, field effect mobility is by far lower than that of an amorphous silicon semiconductor (not more than 1 $cm^2/Vs$) even in the vacuum deposition system for which high mobility has been reported, and is from about 0.1 to about 0.01 $cm^2/Vs$. Further, generally, when the film is formed from the solution, the field effect mobility is further lowered in the order of 1 to 2 figures or location of number because of difficulties in molecular orientation control. In other words, the greatest problem for practical utilization of the organic semiconductors is how to accomplish high field effect mobility through a simple fabrication process.

Generally, the conduction mechanism of the organic semiconductors can be broadly divided into an electric conduction system through the π conjugated system in which the conjugated bonds are distributed inside the molecules, and an electric conduction mechanism through the σ bonds. Polyacetylene and polythiopehene are typical examples of the electrically conductive organic compounds belonging to the former, and polysilane is a typical example of the latter. To obtain an organic semiconductor having high mobility, an organic semiconductor molecular structure which has a large length of the conjugated system chain inside the molecules, and in which activation energy of charge carrier transportation is sufficiently small among the molecules, is suitable. Further, to improve carrier transportation among the molecules, it is effective to orient the organic semiconductor molecules so as to orient the conjugated system in arbitrary directions. As means for controlling the orientation of the organic semiconductor molecules, Japanese Unexamined Patent Publication (Kokai) No. 9-83040 describes an attempt that coats the π conjugated polymer such as polythiophene to an orientation film substrate that is subjected to rubbing treatment, or introduces a liquid crystalline substitution group as the side chain and orients the molecules on the orientation film by external force such as a magnetic field or an electric field.

However, orientation restrictive force by the orientation film is weak in the organic semiconductor molecule not having crystallinity, and sufficient molecular orientation is not accomplished. When the liquid crystalline substitution group is introduced, too, the presence of the substitution groups not contributing to electric conduction lowers the conduction paths of the charge carrier, and mobility drops, on the contrary.

SUMMARY OF THE INVENTION

To solve the prior art problems described above, the present invention aims at providing an electrically conductive organic compound capable of simultaneously accomplishing high molecular orientation and high field effect mobility.

It is another object of the present invention to provide an electrically conductive organic compound that can be produced by a simple method at a low cost.

It is still another object of the invention to provide an electrically conductive organic compound that is useful for producing an electronic device such as electronic paper.

It is a further object of the invention to provide an electronic device having flexibility and high performance.

According to one aspect of the present invention, there is provided an electrically conductive organic compound in which a side chain portion simultaneously exhibiting refractive index anisotropy and a conjugated system electrical conductivity is bonded to a main chain portion exhibiting π conjugated system electrical conductivity.

According to another aspect of the present invention, there is provided an electronic device comprising, in its structure, a constituent element formed using the electrically conductive organic compound of the present invention.

The electronic device according to the present invention is preferably a sheet-like display device comprising a sheet-like display function layer and at least one layer inclusive of a constituent element for causing this layer to function, and the constituent element is formed of the electrically conductive organic compound according to the present invention. The sheet-like display device is typically an electronic paper though it includes various forms.

As will be explained in detail hereinafter, the present invention introduces a π conjugated system skeletal structure into a main chain of molecules of an electrically conductive organic compound as a starting compound, and at the same time introduces a molecule having refractive index anisotropy (in other words, orientation property and liquid crystal property) contributing to molecular orientation and σ conjugated type electrical conductivity as the side chain of the molecules. Accordingly, the present invention can simultaneously improve orientation of the π conjugated type main chain and conductivity of the side chain, and can also improve field effect mobility. In addition, whenever necessary, a substitution group such an alkyl group can be introduced into the molecules, too, so as to improve solubility in a solvent within the range where the effect of the invention is not impeded. When excellent solubility in the solvent can be secured by the introduction of the substitution group, an electronic device having desired performance can be produced by an easy process, that forms a thin film from a solution, such as the casting method and the printing method, without deteriorating high field-effect mobility.

BRIEF DESCRIPTION OF THE DRAWINGS

FIG. 15 is a schematic view of an intelligent road sign as an embodiment of the sheet-like display device according to the present invention;

DESCRIPTION OF THE PREFERRED EMBODIMENTS

Figure 1:
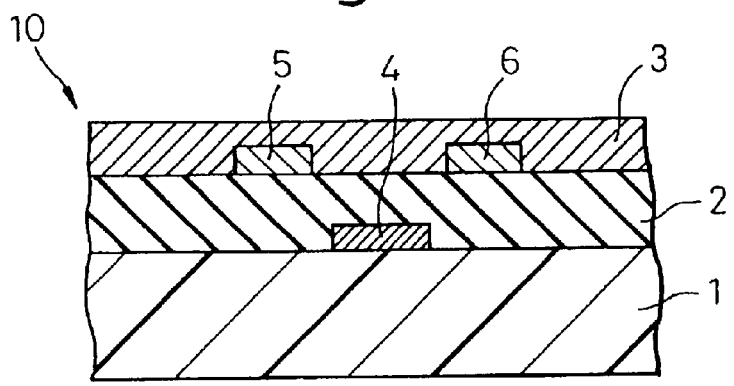
FIG. 1 is a cross-sectional view showing a structural example of an organic thin film transistor according to the present invention.

The electrically conductive organic compound and the electronic device according to the present invention can be advantageously practiced in various forms, respectively.

The electrically conductive organic compound according to the invention comprises a main chain portion and a side portion bonded to the main chain portion. In this organic compound, the main chain portion preferably comprises a cyclic π conjugated system compound. Suitable examples of such a cyclic π conjugated compound include cyclic π conjugated compounds having a high molecular weight such as polythiophene and its derivatives, poly-p-phenylenevinylene, polythienylenevinylene and others, although these compounds are in no way restrictive. Further, the molecular kind and molecular weight of these compounds are not limited so long as adverse influences are not exerted on the function and effect of the invention.

Referring to the general formulas, the main chain portion of the electrically conductive organic compound can preferably have the repeating unit represented by the following general formula (I):

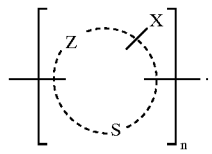

(I)

In the formula (I) given above, Z represents atoms necessary for forming a five-member ring along with a sulfur atom. As will hereinafter be explained in detail, X represents the side chain portion (simultaneously exhibiting refractive index anisotropy and a conjugated type electrical conductivity) to be bonded to the five-member ring Z. Generally, one side chain portion X can provide a sufficient function and effect, but two or more of side chain portions may be combined and bonded, whenever necessary. The five-member ring Z may further comprise an optional substitution group functioning as a solubilization group in a solvent. Though the following examples of such a substitution group are not restrictive, they include an alkyl group such as a methyl group, an ethyl group, a butyl group and a hexyl group, an aryl group such as a phenyl group, an ether group such as a polyethylene oxide group, an alkoxy group such as a methoxy group, an ethoxy group and a propoxy group, a liquid crystal group such as a methogene group, a silane group such as a permethyloligosilane group, a perethyloligosilane group, a permethylpolysilane group and a perethylpolysilane group, or combinations or composites of these groups. Further, n in the formula represents an integer of 1 to 100, preferably 5 to 20.

A preferred example of such a repeating unit can be represented by the following formula (I-1):

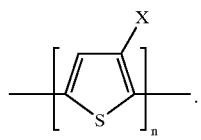

(I-1)

In the formula (I-1) given above, X and n have the same meaning as defined above, and the repeating unit may have an optional substitution group that functions as the solubilization group into the solvent as described above.

Also, the main chain portion of the electrically conductive organic compound can preferably have the repeating unit represented by the following general formula (II):

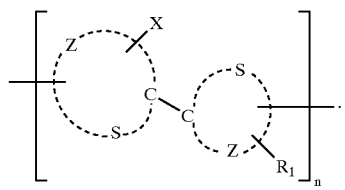

(II)

In the formula (II) given above, each of Z, X and n has the same meaning as defined above. $R_1$ is a hydrogen atom or at least one substitution group that functions as the solubilization group into the solvent. As described above, the substitution group includes the alkyl group, the aryl group, the ether group, the alkoxy group, the liquid crystal group, the silane group or their combinations or composites. Among them, the lower alkyl group such as the methyl group or the ethyl group is particularly effective as the substitution group. The substitution group $R_1$ may be the same as the substitution group X, whenever necessary.

A preferred example of such a repeating unit can be represented by the following formula (II-1):

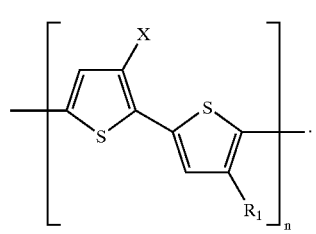

(II-1)

In the formula (II-1) given above, X and n have the same meaning as defined above. The repeating unit may contain an optional substitution group functioning as the solubilization group into the solvent, as described above.

In the electrically conductive organic compound according to the present invention, the repeating unit described above is generally used alone, but two or more kinds of repeating units may be used in a regular or random combination, whenever necessary. When the repeating units of the formulas (I) and (II) are A and B, for example, they can be combined in the following way, for example:

-A-A-A-A-A-A-;
-B-B-B-B-B-B-;
-A-B-A-B-A-B-; or
-A-A-A-B-A-A-.

If desired, a repeating unit or units other than A and B may be interposed between the units A and/or B.

In the electrically conductive organic compound according to the present invention, the side chain portion to be bonded to the main chain portion is not particularly limited so long as it can simultaneously satisfy refractive index anisotropy and σ conjugated system electrical conductivity. When the orientation property of the main chain portion and the exhibited characteristics are taken into consideration, however, a side chain portion whose refractive index anisotropy relies on smectic liquid crystal property and a side chain portion whose refractive index property relies on nematic liquid crystal property are suitable. Such side chain portions preferably have a silane structure represented by the following general formula (III):

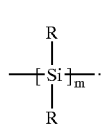

(III)

In the formula (III) given above, R may be the same or different and each represents a lower alkyl group such as a methyl group or an ethyl group, and m is an integer of 5 to 20.

Suitable examples of such side chain portions include silane compounds such as permethyloligosilane, polymethylsilane and their derivatives, but the present invention is not limited to these compounds so long as adverse influences are not exerted on the functions and effects of the present invention. These side chain portions may be bonded either directly or through an optional bonding group (generally, functional group) to the main chain portion.

As explained above, the electrically conductive organic compound according to the present invention includes a wide veriety of organic compounds within the range that satisfies the requirements described above. These electrically conductive organic compounds generally and preferably have a molecular weight (weight average molecular weight) of about 1,000 to about 100,000 though they do not in any way limit the scope of the present invention. Of course, the organic compounds may have a molecular weight outside this range as long as the intended functions and effects can be achieved.

According to the finding of the present inventors, the electrically conductive organic compounds that can provide particularly excellent results among the organic compounds according to the present invention are those which are expressed by the following general formula (IV) or (V):

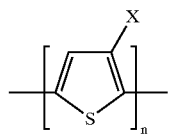

(IV)

where X: —$R_2$—(Si(CH$_3$)$_2$)$_m$—CH$_3$,
$R_2$: —CH$_2$—O—, —CH$_2$—, —C$_2$H$_4$— or —O—CH$_2$—,
m=5 to 20, and
n=1 to 100.

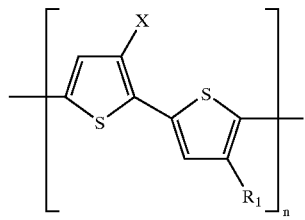

(V)

where X: —$R_2$—(Si(CH$_3$)$_2$)$_m$—CH$_3$,
$R_1$: H, CH$_3$ or C$_2$H$_5$,
$R_2$: —CH$_2$—O—, —CH$_2$—, —C$_2$H$_4$— or —O—CH$_2$—,
m=5 to 20, and
n=1 to 100.

As described above, the electrically conductive organic compound according to the present invention has the main chain portion exhibiting π conjugated system electrical conductivity along with the side chain portion simultaneously exhibiting refractive index anisotropy and σ conjugated system electrical conductivity, bonded to a suitable position of the main chain portion, and owing to this construction, the electrically conductive organic compound has high mobility. In other words, field effect mobility of this organic compound calculated by the method described in the afore-mentioned references is generally about 0.001 to about 0.03 cm$^2$/Vs. When field effect mobility is lower than 0.001 cm$^2$/Vs, the problem occurs in that the response speed of the electronic device becomes extremely slow.

Further, the electrically conductive organic compound according to the present invention generally has conductivity within the range of about $10^{-6}$ to about $10^{-9}$ S/cm. When conductivity is lower than $10^{-9}$ S/cm, the problem occurs in that the driving voltage of the electronic device becomes great. When it exceeds $10^{-6}$ S/cm, on the contrary, a current flowing between the electrodes becomes great even when a gate voltage is not applied in the electronic device, particularly in a field effect transistor, so that an ON/OFF current ratio becomes small. Conductivity of the electrically conductive organic compound is preferably from about $10^{-6}$ to $10^{-8}$ S/cm.

The electrically conductive organic compound according to the present invention is preferably used in the form of being dissolved in a solvent. Though the solvent is not particularly limited to those listed below, preferred examples include toluene, xylene, acetonitrile, tetrahydrofuran, chloroform and ethanol. Therefore, the electrically conductive organic compound of the invention is dissolved in a predetermined concentration in such a solvent to prepare a solution, and the solution can then be applied to, and cured on, a substrate by an application method such as casting, dip-coating or spin coating, or by a printing method such as screen printing. Such a film forming method can be worked more conveniently and at a lower cost than the vacuum deposition method, etc, used in the prior art.

The electrically conductive organic compound of the invention can be advantageously prepared from polythiophene and its derivatives or other cyclic π conjugated system organic compounds by a customary synthesizing method. For example, 3-thiophene methanol is polymerized in the same synthetic sequence as polyhexylthiophene (e.g. R. M. Souto et al, *Macromolecules*, 23, p1268-1279, 1990), and the resulting polymer is stirred with permethyloligosilne having a chloro group introduced at one of its terminals in a toluene solvent to which pyridine is added and is condensed. The condensation time is about 5 hours. Thus, a polythiophene derivative having the permethyloligosilne group introduced into the side chain thereof can be synthesized at a high yield.

The electrically conductive organic compound of the invention can be advantageously used as one of the constituent elements of various electronic devices while utilizing by its excellent characteristic properties such as high molecular orientation and high field effect mobility. Here, the term "constituent element" represents a component, a device, or the like, that constitutes the electronic device (display device, etc) according to the invention, and is sometimes called the "device". Though the constituent element is not limited to those listed below, it includes various devices such as power source devices. Examples of the devices include a driving circuit, a control circuit, a communication circuit, a high acoustic signal conversion device, and so forth. A display functional device may be the constituent element.

A sheet-like display device as a typical example of the electronic device includes the following devices. Note, however, that the following devices are not all of the sheet-like display device according to the present invention.
(1) A sheet-like display device comprising a sheet-like display function layer having a pair of opposing electrode plates at least one of which is transparent, and exhibiting a predetermined display operation by imparting a change to optical absorption or optical reflection characteristics, and a sheet-like power source layer for supplying a power source necessary for driving the display function layer to the display function layer, wherein both layers are integrally formed.
(2) The sheet-like display device described in the item (1), which uses, as a display element used for the sheet-like display function layer, an electrophoretic display device, and wherein a dispersion system containing electrophoretic particles is sealed between the pair of opposing electrode plates at least one of which is transparent, and a distribution state of the electrophoretic particles inside the dispersion system is changed under the operation of a display control voltage applied between the electrodes so as to impart the change to the optical absorption or optical reflection characteristics and to exhibit the predetermined display operation.

(3) The sheet-like display device described in the item (1), which uses, as a display element used for the sheet-like display function layer, a microcapsule reflection type display device, and wherein colored particle-like microcapsules capable of reversion in accordance with the direction of an electric field applied between the pair of opposing electrode plates at least one of which is transparent, and the arrangement direction of the microcapsules is changed by the operation of the display control voltage applied between the electrodes so as to impart the change to the optical absorption or optical reflection characteristics and to exhibit the predetermined display operation.

(4) The sheet-like display device described in the item (1), which uses, as a display element used for the sheet-like display function layer, a polymer dispersion type liquid crystal display device, and wherein fine pores are formed in a polymer material and a liquid crystal compound is embedded in the fine pores.

(5) The sheet-like display device described in the item (1), which uses, as a display element used for the sheet-like display function layer, a device exhibiting an electroluminescence phenomenon, and wherein the optical absorption or optical reflection characteristics are changed by a current flowing through the pair of opposing electrode plates at least one of which is transparent, and the electroluminescence phenomenon is exhibited.

(6) The sheet-like display device described in the item (1), which uses, as a display element used for the sheet-like display function layer, a device exhibiting an electrochromism phenomenon, and wherein the optical absorption or optical reflection characteristics are changed by a current flowing through the pair of opposing electrode plates at least one of which is transparent, and the electrochromism phenomenon is exhibited.

(7) A sheet-like display device including a sheet-like display function layer having one electrode plate, and exhibiting a predetermined display operation by imparting a change to optical absorption or optical reflection characteristics in accordance with an electric field applied, or a current flowing, between the electrode plate and a predetermined write electrode, and a sheet-like power source layer for supplying a power source necessary for driving the display function layer to the display function layer, wherein both layers are integrally formed.

(8) The sheet-like display device as described in the item (7), which includes, as a display element used for the sheet-like display function layer, a dispersion system having one electrode plate and capable of undergoing eletrophoresis by an electric field applied between the electrode plate and a predetermined write electrode, and wherein a distribution state of electrophoretic particles inside the dispersion system is changed under the operation of a display control voltage applied between the electrodes so as to impart the change to the optical absorption or optical reflection characteristics and to exhibit the predetermined display operation.

(9) The sheet-like display device as described in the item (7), which includes, as a display element used for the sheet-like display function layer, a microcapsule reversion type display device having one electrode plate and microcapsules sealed between the electrode plate and a predetermined write electrode, wherein the arrangement direction of the microcapsules is changed under the operation of a display control voltage applied between the electrodes to exhibit the predetermined display operation.

(10) The sheet-like display device described in the item (7), which uses, as a display element used for the sheet-like display function layer, a device having one electrode plate and exhibiting an electrochromism phenomenon, and wherein the optical absorption or optical reflection characteristics are changed by a current flowing through the electrode plate and a predetermined write electrode, and the electrochromism phenomenon is exhibited.

(11) The sheet-like display device as described in the item (1) or (7), which uses a magnetic display element as the device used for the sheet-like display function layer.

(12) The sheet-like display device as described in the item (1) or (7), which uses a sheet-like primary cell having a pair of electrodes capable of undergoing the irreversible oxidation-reduction reaction and a sheet-like electrolyte connecting between the electrodes as the power source device used for the sheet-like power source layer.

(13) The sheet-like display device as described in the item (1) or (7), which uses a sheet-like secondary cell having a pair of electrodes capable of undergoing the irreversible oxidation-reduction reaction and a sheet-like electrolyte connecting between the electrodes as the power source device used for the sheet-like power source layer.

(14) The sheet-like display device as described in the item (1) or (7), which uses a sheet-like photocell (or solar cell) capable of generating electric power upon irradiation of light as the power source device used for the sheet-like power source layer.

(15) The sheet-like display device as described in the item (1) or (7), which uses a sheet-like thermo-electromotive cell capable of directly converting the difference of heat to electric power as the power source device used for the sheet-like power source layer.

(16) The sheet-like display device as described in the item (1) or (7), which uses a sheet-like capacitor device having a pair of electrodes and a dielectric or electrolyte connecting the electrodes as the power source device used for the sheet-like power source layer.

(17) A sheet-like display device comprising an integral structure of (a) a sheet-like display function layer, (b) a sheet-like power source layer and (c) a layer for both, or one, of a driving circuit and a control circuit.

(18) A sheet-like display device having a display function and a communication function, comprising an integral structure of (a) a sheet-like display function layer, (b) a sheet-like power source layer and (c) a layer for both, or one, of a driving circuit and a control circuit, and for a communication layer.

(19) The sheet-like display device as described in the item (18), which uses a circuit using electromagnetic energy, optical energy or acoustic energy for transmission means, as the communication circuit described above.

(20) A sheet-like display device having a display function and an acoustic conversion function, comprising an integral structure of (a) a sheet-like display function layer, (b) a sheet-like power source layer and (c) an acoustic signal conversion element layer capable of converting an acoustic signal to an electric signal or vice versa, or both of them.

(21) A sheet-like display device having a display function and an acoustic conversion function, comprising an integral structure of (a) a sheet-like display function layer, (b) a sheet-like power source layer, (c) an acoustic signal conversion element layer capable of converting an acoustic signal to an electric signal or vice versa, or both of them, and (d) a layer for both, or one, of a driving circuit and a control circuit.

(22) A sheet-like display device having a display function, an acoustic conversion function and a communication function, comprising an integral structure of (a) a sheet-like display function layer, (b) a sheet-like power source layer, (c) an acoustic signal conversion element layer capable of converting an acoustic signal to an electric signal or vice versa, or both of them, and (d) a layer for both, or one, of a driving circuit and a control circuit, and for a communication layer.

(23) A sheet-like display device comprising an integral structure of (a) a sheet-like display function layer and (b) a layer for at least one of a driving circuit, a control circuit and a communication circuit.

(24) A sheet-like display device comprising at least (a) a sheet-like display element and (b) an external connection element. For example, this sheet-like display device can display information from electronic/electric appliances when electrode terminals disposed on the end face of the sheet-like display device (which may be extensible to outside from the sheet-like display device at the time of use) is inserted into connection means (slot, etc) of the external electronic/electric appliances to establish connection with electrode terminals inside the slot. In this case, the whole or a part of the necessary devices such as a driving circuit, a control circuit, etc, may be disposed on the sheet-like display device side or on the appliance side to be connected.

(25) The sheet-like display device comprising any of the display devices described above, wherein an input device is provided as data input means to add an input function. An example of the data input device is a so-called "touch sensor type keyboard". This can be assembled as a part in the display device.

Though the following examples are not restrictive, examples of electronic elements suitable for practicing the present invention include organic thin film transistors such as FET (Field Effect Transistors) and others. The organic thin film transistor according to the invention can be particularly advantageously achieved in the form of so-called "electronic paper". Further, an example of an electronic element other than the organic thin film transistor includes a diode.

The explanation will be given in further detail referring to the accompanying drawings. FIG. 1 schematically shows an organic thin film transistor 10 as an embodiment of the electronic element according to the present invention. This organic thin film transistor 10 can be produced in the following manner, for example.

First, a gate electrode 4 is formed by suitable means such as sputtering of gold or etching on a substrate 1 made of a flexible plastic material such as polyether sulfone (PES) or a polyethylene terephthalate (PET). An organic material having a high dielectric constant such as polyacrylonitrile, polyvinylidene fluoride or cyano-ethylated pullulan is applied to the surface of the substrate 1 inclusive of the gate electrode 4, and is then cured to form a gate insulating film 2. If necessary, orientation treatment is applied to the gate insulation film 2 to provide a function of an orientation film to this gate insulation film 2. Alternatively, an orientation film (not shown) may be further deposited on the gate insulation film 2. In this case, the kind of the orientation film formed on the gate insulation film is a polyimide film subjected to rubbing treatment, a polyimide film to which deflected ultraviolet rays are irradiated, or a polyimide film or polyvinyl cinnamate film the molecules of which are orientation-polymerized in a specific direction by deflected ultraviolet rays, though these examples are not restrictive.

Next, a source electrode 5 and a drain electrode 6 are arranged on this gate insulation film 2 to prepare a transistor substrate. Here, any material may be used as the electrode material of the gate, source and drain of the transistor so long as the function of the resulting transistor is not adversely affected. Besides a metal such as gold described above, it is also possible to use inorganic compound type materials such as indium tin oxide (ITO) and tin oxide ($SnO_2$), and electrically conductive polymer materials such as doped polyaniline, polypyrrole and polythiophene.

After the transistor substrate was fabricated in the manner described above, the electrically conductive organic compound according to the present invention is dissolved in a suitable solvent such as toluene, and the resulting coating solution is applied to the transistor substrate by casting, dip coating or spin coating and is then cured. A channel layer 3 is formed as shown in the drawing. The film thickness of the channel layer 3 varies depending on the kind of the transistor but is generally from about 10 to about 500 nm. The coating solution of the electrically conductive material may be printed by a printing method in place of the coating methods described above. For example, the coating solution can be printed to only the selected portion or portions of the substrate by screen-printing with a mask. It is further possible to utilize a printing process that applies the solution to a rubber stamp, or the like, and then transfers it to predetermined positions on the substrate. In any of these means, the electric field may be impressed between the source-drain electrodes to orient the electrically conductive compound before the solvent dries. A protective layer such as a moisture-proofing layer may be disposed to prevent mixture of impurities and moisture into the resulting channel layer 3 as long as the operation of the transistor is not impeded.

In the organic thin film transistor 10 produced through a series of production steps described above, the quantity of the current flowing between the source-drain electrodes can be modulated by a gate voltage. Because of molecular orientation and the contribution effect of the side chain to conduction as the objects of the invention, the invention can accomplish high field-effect mobility that cannot be obtained by the soluble organic semiconductors according to the prior art. As the application method or the printing method of the solution can accomplish high field-effect mobility equivalent to that of the organic semiconductor compound formed by vacuum deposition according to the prior art, the invention can contribute to the reduction of the cost. Further, the substrate used hereby is the flexible plastic substrate, but similar effects can be obtained by using substrates not having flexibility such as a silicon substrate. Therefore, the electrically conductive organic compound can be applied to other electronic devices for which high field-effect mobility and a lower cost are required by a simple process, besides the field effect transistor fabricated on the plastic substrate.

The electronic device according to the invention includes various sheet-like display devices. In these display devices, the display device and various devices for causing the display device to function, such as a power source device, a driving circuit, a control circuit, a communication circuit, an acoustic conversion device, etc, that have been discrete devices in the past, are formed into a unitary assembly so as to improve a space factor and to accomplish a large area of the display portion and a ultra-thin display device itself.

To obtain such a peculiar sheet-like display device, the invention employs a printing technology and a laminate technology that are advantageous for forming each device as a sheet form.

Figure 2:
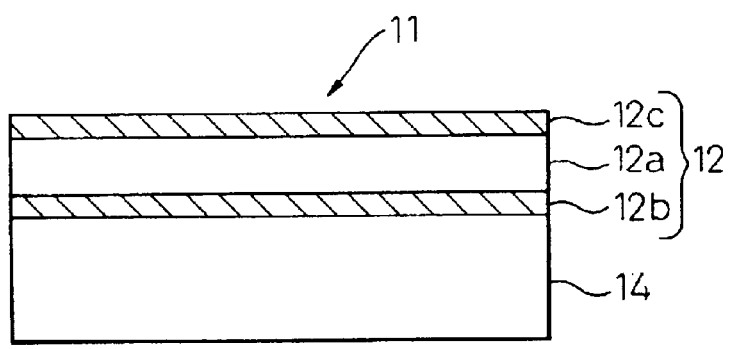
FIG. 2 is a cross-sectional view of a sheet-like display device according to a basic embodiment of the present invention.

For example, a display device 11 according to the basic form of the invention typically shown in FIG. 2 includes a display function layer 12 and a power source layer 14, both in the form of sheet. The display function layer 12 can be formed from various sheet-like devices exhibiting the display function on the basis of various principles. In the display device 11 shown in the drawing, the display function layer 12 includes a display layer 12a and a pair of electrodes 12b and 12c interposing the display layer 12a. The display function layer 12 can be formed from the electrically conductive organic compound according to the invention.

In a sheet-like display device comprising the combination of an electrophoretic type display device and a power source device, for example, microcapsules incorporating electrophoretic particles are printed on a flexible substrate such as a polyester having transparent electrodes vacuum deposited thereto, by a technology such as screen printing, roller printing, ink jet printing, electrophotography, or the like, and are combined with an opposing electrode. One of the electrode materials of the power source device is applied to the back of the substrate. After an electrolytic sheet is put on the electrode material, a sheet applied with the other electrode material is bonded to the electrolytic sheet and is subjected to lamination processing. In this way, a display device having the sheet-like display device and the sheet-like power source device integrated with each other can be produced.

Besides the display device described above that applies the principle of electrophoresis, it is possible to employ any optional display methods based on the principles suitable for a sheet-like display such as the one that applies rotation of colored microcapsules by the electric field, a so-called "polymer dispersion type liquid crystal device" including a liquid crystal sealed into a polymer material, the one that applies electrochromism or electroluminescence, and a magnetic recording system that moves fine magnetic particles by controlling magnetism.

The electroluminescence display (ECD) as a display device that applies electrochromism, for example, displays a color change by utilizing an absorption factor of light (absorbance) that changes upon the oxidation or reduction reaction.

Such a device comprises an electrochromic thin film, a display electrode, an opposing electrode and an electrolyte, and the color change is exhibited when the electrochromic thin film formed on the display electrode is oxidized or reduced in accordance with the potential of the display electrode.

At least one of the display electrode and the opposing electrode is a transparent electrode, and thus the absorption color change of the electrochromic thin film can be seen from outside.

An electrically conductive thin film such as tin oxide, tin-doped indium oxide or polyaniline can be used as the transparent electrode.

The electrically conductive organic compound according to the invention can be used as the electrochromic thin film.

It is possible to use, as the electrolyte, a liquid electrolyte prepared by dissolving a lithium salt such as $LiClO_4$, $LiBF_4$, $LiPF_6$, $LiCF_3SO_3$, etc, in a nonaqueous solvent such as propylene carbonate, acetonitrile or γ-butyrolactone, or a so-called "solid electrolyte" prepared by mixing a resin such as acrylonitrile or polyethylene oxide, the lithium salt and a solvent such as propylene carbonate, heat-melting the mixture and then cooling it, or curing the mixture by a cross-linking agent, into a semi-solid or solid form.

The electroluminescence (EL) device as a display device that applies electroluminescence is a generic term of complete solid devices that self-emit light upon the supply of a current. Inorganic EL devices such as of a ZnS/Mn type have been developed in the past, but they involve the problems that the driving voltage is as high as about 100 V and sufficient luminescence cannot be obtained. On the other hand, development of organic electroluminescence (organic EL) devices suitable for thin displays has been made a progress in recent years. The organic EL has high visibility due to its self-emission property, has a fast response, can reduce both weight and thickness, and can be driven at a low voltage below several volts. Therefore, its application to an economical large area full-color flat panel display is expected, and researches have vigorously been made at present (cf.: "Nikkei Electronics", Jan. 29, 1996, P99).

The operation principle of the organic EL devices in general is approximate to the operation principle of light emitting diodes, and they use a light emitting layer (an organic semiconductor thin film capable of fluorescent emission), a carrier transportation layer and a pair of opposing electrodes sandwiching them. The light emission phenomenon is based on the principle such that when an electric field is applied between both electrodes, electrons are injected from the negative electrode whereas positive holes are injected from the positive electrode, and when the electrons and the positive holes are re-combined in the light emitting layer, optical energy corresponding to the difference of energy is emitted as the energy level returns from the conduction band to the valence electron band.

The light emitting layer and the carrier transportation layer generally and respectively use a π electron type organic semiconductor material. The electrically conductive organic compound according to the invention is used as the material of the light emitting layer. The positive hole transportation layer as the carrier transportation layer uses a triphenylamine derivative (TAD) and the electron transportation layer uses an oxadiazole derivative (PBD).

To achieve diversification of light emitting colors and long-term stability of the light emitting layer, the range of materials for the light emitting layers has been expanded, and a system containing fluorescent pigment molecules mixed in an amorphous polymer medium and a light emitting layer using alone a polymer such as polyphenylene derivative (PPV) have been proposed.

The light emitting layer and the carrier (positive hole and electron) transportation layers disposed on both sides of the former are inserted between the cathode electrode as the electron injection plate and the anode electrode for injecting the positive holes and constitute a laminate.

The laminate constituted by the above layers is generally disposed on a substrate.

The substrate is a support of the EL device. A transparent substrate such as glass, plastics, etc, is generally used. When the plastics are used, preferred examples include polyethylene terephthalate, polycarbonate, polymethyl methacrylate, polysulfone, polybutene and polymethylpentene.

A transparent electrode is disposed as the anode electrode on the substrate. An indium tin oxide (ITO) thin film or a film of tin oxide can be used as the material of the transparent electrode. It is also possible to use a metal having a large working function such as aluminum or gold, copper iodide, and electrically conductive polymers such as polyaniline, poly(3-methyl thiophene) and polypyrrole. It is further possible to use the electrically conductive organic compound according to the invention.

The vacuum deposition method or the sputtering method can be used to form the anode electrode. In the case of the electrically conductive polymer, a soluble electrically conductive polymer can be used, or a mixed solution of the polymer with a suitable binder resin is applied to the substrate. Alternatively, the film can be directly formed on the substrate by electrolytic polymerization. The film thickness of the anode electrode is selected so that the transmission factor of visible light is at least 60%, preferably at least 80%. The thickness of the anode electrode is generally 10 to 1,000 nm, preferably 20 to 500 nm.

The film thickness of the light emitting layer is generally 10 to 200 nm and preferably 20 to 80 nm. The organic light emitting material used for this light emitting layer is effectively a compound that has high fluorescent quantum efficiency, high electron injection efficiency from the cathode electrode and high electron mobility. An oxyquinoline type complex such as 8-hydroxyquinoline-aluminum complex ($AlQ_3$) is used for this compound. The light emitting layer contains a diphenylanthracene type compound, a naphthostyryl type pigment (NSD), a coumarin derivative, a pyran derivative and a rubrene type compound.

Various metal materials can be used for the cathode electrode, and Mg, Li, Ca and their alloys having a small working function are preferred. Examples include a magnesium-aluminum alloy, a magnesium-silver alloy, a magnesium-indium alloy, an aluminum-lithium alloy and aluminum. In the invention, when the power source layer is used in combination, it is preferred that the metal material can be conjointly used as the electrode material of the cell.

The electron transportation material between the light emitting layer and the cathode electrode layer must be the material that has high electron affinity and high electron mobility. Examples of such a material include a cyclopentadiene derivative, a bis-styrylbenzene derivative, an oxadiazole derivative, a triazole derivative, a p-phenylene compound or its polymer, or a phenanthroline derivative.

On the other hand, a material having a low injection barrier from the anode electrode and high positive hole mobility is used as the positive hole transportation material between the light emitting layer and the anode electrode layer. Examples of such a material include aromatic diamine compounds such as N,N'-diphenyl-N,N'-bis(3-methylphenyl)-1,1'-biphenyl-4,4'-diamine (TPD) and 1,1'-bis(4-di-p-tolylaminophenyl) cyclohexane, a hydrazone compound and a tetraphenylbutadiene compound. A polymer material such as poly-N-vinylcarbazole and polysilane can also be used.

Figure 3:
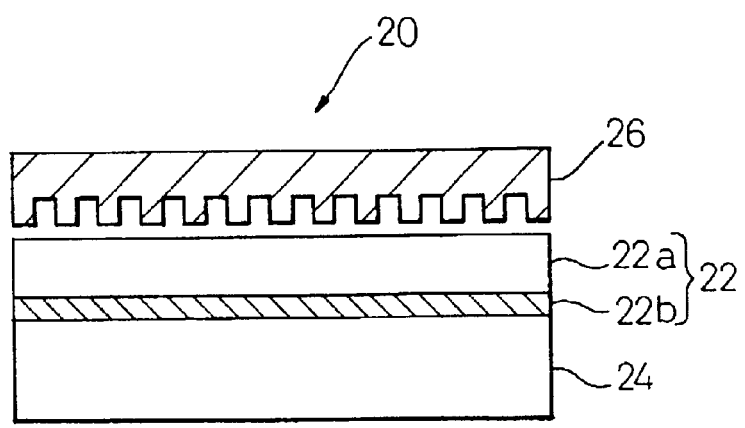
FIG. 3 is a cross-sectional view showing a sheet-like display device according to another embodiment of the present invention.

In the display devices of the electrophoretic type, the microcapsule reversion type and the electrochromism type, only one electrode is provided to the display element inside the display device, and the display information can be re-written when an electric field or a current is applied from an external write electrode. FIG. 3 schematically shows the sheet-like display device of this form. In FIG. 3, reference numeral 20 denotes the sheet-like display device. Reference numeral 22 denotes a display function layer, which includes a display layer 22a and an electrode 22b. A write electrode 26 is disposed on the opposing side to the electrode 22b. In this display device, a write device such as a printer or a hand scanner must be disposed outside the display device.

In the practice of the invention, various display elements can be used. When flexibility and foldability of the display device produced by using such display elements are taken into consideration, however, it is more suitable to use a display element of the type that contains rotating spheres (spherical rotating members) or electrophoretic particles inside microcapsules.

Examples of the electrode material for the power source element include those belonging to a so-called "primary cell type" such as zinc/graphite, manganese dioxide, lithium/manganese dioxide and zinc/air as the electrode material, those belonging to a so-called "secondary cell type" such as carbon/lithium absorptive metal oxides capable of absorbing nickel, cadmium and lithium, or a lithium metal/conductive polymer as the electrode material, a single crystal silicon and amorphous silicon type, a polysilicon type, those belonging to a solar cell type such as an organic pigment and an inorganic pigment, those belonging to a thermoelectric conversion cell type utilizing the Seebeck effect, and those belonging to capacitors such as an electrolytic capacitor and an electric double-layered capacitor. Among them, a so-called "solid electrolyte" obtained by solidifying the electrolyte is preferably used for the primary cell type, the secondary cell type and the capacitor type that utilize the electrochemical reaction.

In the sheet-like display device according to the invention, a circuit-built-in layer including circuits necessary for driving and controlling the display element may be integrally introduced, in addition to the display function layer and the power source layer. In the display device, the circuit-built-in layer should be those which do not deteriorate flexibility of the display device.

Next, concrete embodiments of the sheet-like display device will be listed, but the invention is not limited to the following embodiments.

(1) Electronic newspaper, foldable electronic magazines and books that receive information through the Internet and satellite broadcasting, display only desired information, and can be read in a freely folded state, electronic catalogs having input means capable of placing order for merchandises, etc.

(1-1) Electronic Newspaper

Form Example:

From tabloid size to normal newspaper size, as thin as paper and foldable.

Example of Functions:

reception, data memory, screen switching, expansion/reduction of display information, etc.

Example of Constituent Elements:

display portion, driving circuit, power source, communication (reception) circuit, control circuit, memory, touch key, etc.

Figure 4:
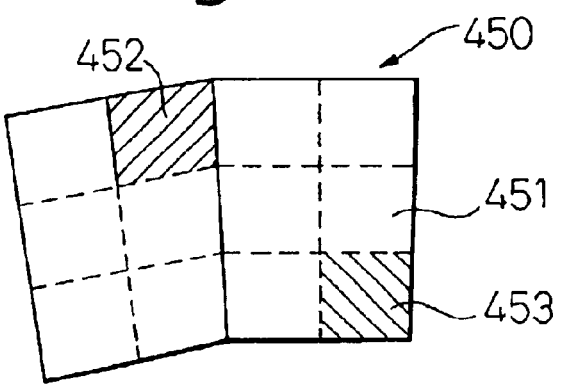
FIG. 4 is a schematic view of an electronic newspaper as an embodiment of the sheet-like display device according to the present invention.

Application Example:

FIG. 4 shows an outline of the device. The latest news are received at a predetermined time through an antenna (not shown) disposed around the display portion 451 having the newspaper size, and are stored in the memory. The news having a designated high priority is displayed at a predetermined position. The layers other than the display layer, that have somewhat lower flexibility and foldability are disposed in the minimum size of folding of the electronic newspaper 450 at a designated position (at oblique line portion 452 in the drawing), and can be arbitrarily folded at other positions. When the newspaper is folded at a predetermined position represented by corrugated line in the drawing, it can be compactly folded to the minimum size. Since the display information is kept even under the folded state, the newspaper can be read in the same way as the ordinary newspaper. A touch input key of a transparent thin layer for conducting a switch operation by the change of an electrostatic capacitance or resistance value is disposed at a part of the display surface (at another oblique line portion 453) in the drawing, and the information stored in the memory can be successively displayed by the key operation.

(1-2) Electronic Books and Magazines:

Form Example:

The size ranges from a paperbacked book size to large magazine size; as thin as paper; a plurality of sheets can be bundled at one of the ends and can be turned over; foldable into a cylindrical shape.

Examples of Functions:

reception, data memory, screen switching, enlargement/reduction, automatic screen updating with turning-over of pages, page selection, memorandum input, etc.

Examples of Constituent Elements:

display portion, driving circuit, power source, communication (reception) circuit, control circuit, memory, input means, front cover, etc.

Figure 5:
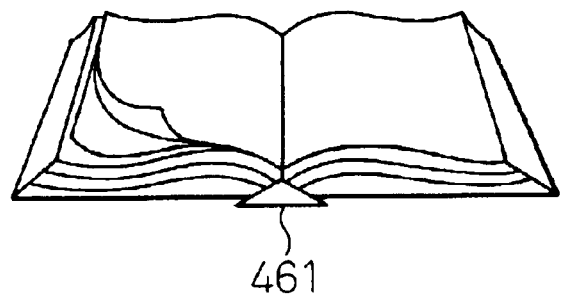
FIG. 5 is a schematic view of an electronic book as an embodiment of the sheet-like display device according to the present invention.

Application Examples:

FIG. 5 shows an outline of the device. A plurality of sheets is bundled by using a back cover 461. An electronic circuit and electronic components are stored at this portion so that components having low shape changeability can be used. Display is conducted on both surfaces of the display layer, and the turning-over operation can be made in the same way as the book. When the last page is turned over, a sensor inside the back cover detects the operation of returning the page to the first page and automatically updates and displays the next page. Incidentally, a touch key may be provided to the back cover so as to control display switching by the key input in addition to the reception and display control. Further, a touch position sensor is disposed on the entire surface of the display surface so that a hand-written character and illustration can be inputted to the display surface by an electronic pen capable of applying a pen pressure or an electric field, and can be digitized and stored in the display element and the memory. Such information is associated as a memorandum with the page information of the books, etc, and can be automatically displayed when the page is displayed.

(1-3) Electronic Catalog Having Input Means:

Form Example:

Large magazine size; as thin as paper; a plurality of sheets can be bundled at one of the ends and can be turned over; foldable into a cylindrical shape.

Examples of Functions:

reception/transmission, data memory, screen switching, enlargement/reduction, input, etc.

Examples of Constituent Elements:

display portion, driving circuit, power source, communication (transmission/reception) circuit, control circuit, memory, input means, front cover, etc.

Figure 6:
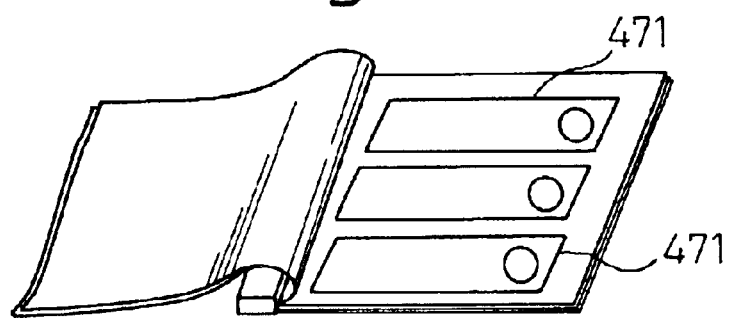
FIG. 6 is a schematic view of an electronic catalog as an embodiment of the sheet-like display device according to the present invention.

Application Examples:

FIG. 6 shows an outline of the device. The electronic catalog has input means such as a touch key or an electronic pen, and displays merchandise information 471. Necessary fields are in advance registered for the merchandise information, and are automatically updated upon receipt of an update report by communication. The screen can be switched to display of the merchandise list to the detailed information. When only the switch is operated on the basis of the individual information that is default-inputted by the communication function, order can be placed and electronic settlement is made from the registered bank account. Retrieval and display of various merchandises other than those of the registered fields can be made, and order form them can also be placed.

(2) Display board (electronic bulletin) system that can be put on the wall and can be removed therefrom, and automatically receives and updates the local information:

Form Example:

From A4 to A3 size (foldable to A4 size); sheet-like that can be bent to a certain extent; can be fitted to, and removed from, the wall.

Examples of Functions:

reception/transmission, data memory, screen switching, enlargement/reduction, input, individualization of components (constituent elements), etc.

Examples of Constituent Elements:

display portion, driving circuit, power source, communication (transmission/reception) circuit, control circuit, memory, input means, signal display means, etc.

Figure 7A:
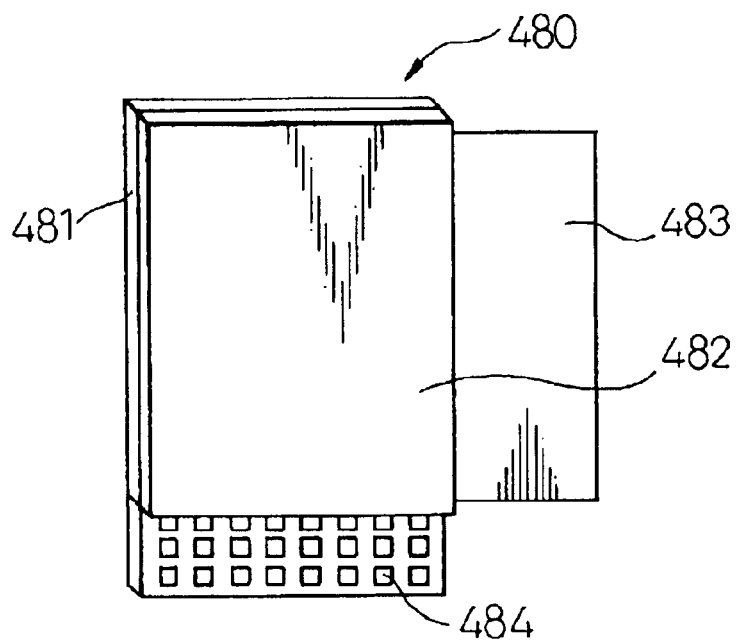
FIGS. 7A and 7B are schematic views of a display board system as an embodiment of the sheet-like display device according to the present invention.
Figure 7B:
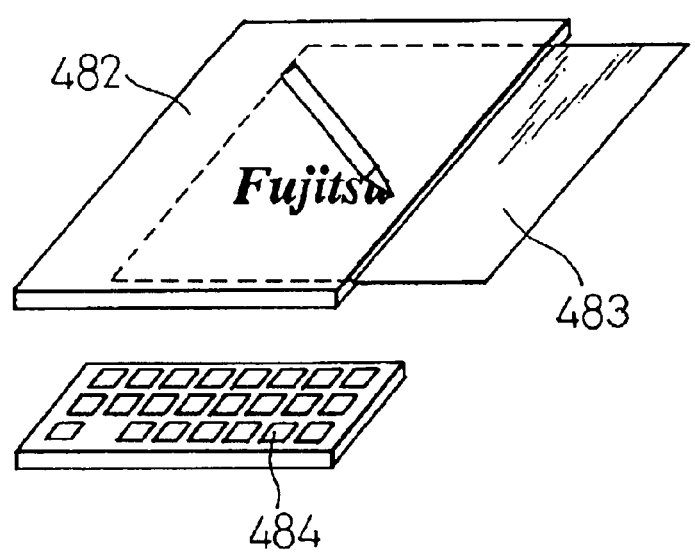

Application Example:

FIGS. 7A and 7B show an outline of the display board system 480. The system having the connection terminals, reception/transmission means, data memory means, screen-switching means, enlargement/reduction means and input means is put on the wall. The portion 481 fixed to the wall includes a communication circuit and signal means (not shown), and a display/input portion 482 having the driving circuit, the control circuit and the power source is removably fitted to this portion. A display element 483 such as paper is set to the display/input portion 482. The information is automatically updated, and signal means (that generates signals of light and sound) notifies updating of the data. The system further includes input means 484 such as a keypad and electronic pen input means. The display portion can confirm and transmit the input information both when the input means 484 is set to the wall and when it is removed from the wall. The display element 483 can be removed and carried around. In this case, the information is displayed and kept without the power source. The display/input portion 482 can be operated to make key input or handwriting input on the desk even when it is removed from the wall. Data exchange among the portions individually cut off can be made through the electrodes and the communication means disposed at the end portion of each member.

(3) A communication tool for calling a communication person parson through only the operation of the buttons (input function) displayed on the screen, making conversion, and transmitting the information inputted from the screen to the communication person.

Form Example:

From A4 to A3 size (foldable to A4 size); at least the display portion is as thin as paper, can be folded and made into a cylindrical shape.

Examples of Functions:

reception/transmission, data memory, screen switching, enlargement/reduction, input, audio and video input, etc.

Examples of Constituent Elements:

display portion, driving circuit, power source, communication (transmission/reception) circuit, control circuit, memory, input means, audio input/output means, video input means, etc.

Figure 8A:
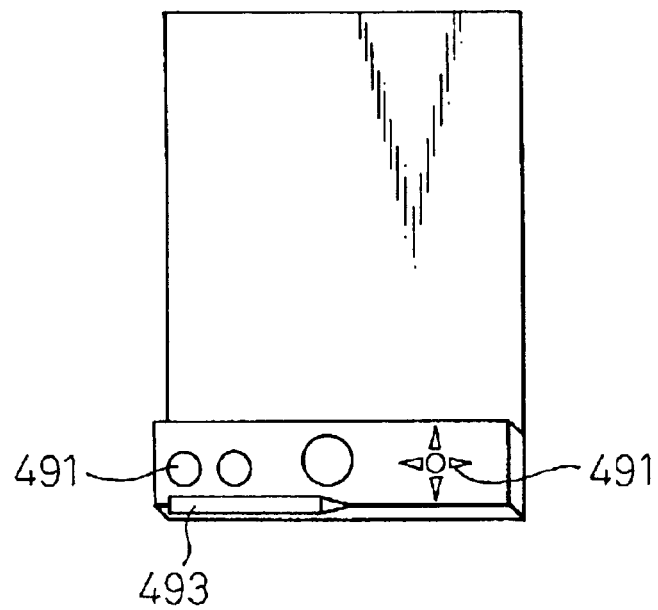
FIGS. 8A and 8B are schematic views of a communication tool as an embodiment of the sheet-like display device according to the present invention.
Figure 8B:
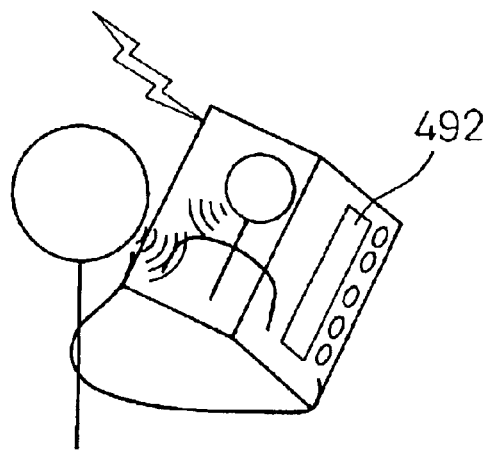

Application Example:

FIGS. 8A and 8B show an outline of the device. Communication is made only through the input using the key 491, and conversation can be made while looking the face of the communication person. Video input means (not shown) such as a camera and a scanner can input and transmit the acquired video information 492. The display screen can be taken up with the key input portion as the center. A touch key (not shown) can be formed at a part of the display screen in such a fashion that when the input operation is not necessary, the key input portion can be erased from the screen. Handwriting input can be done, through the electronic pen 493.

(4) Electronic wallpaper system capable of freely changing color, pattern, design, etc, by electric signals:

Form Example:

A wallpaper-like elongated form (width of at least 60 cm and a length of at least tens of meters).

Example of Functions:

image updating, etc.

Examples of Constituent Elements:

reception, data memory, screen switching, input, etc.

Figure 9:
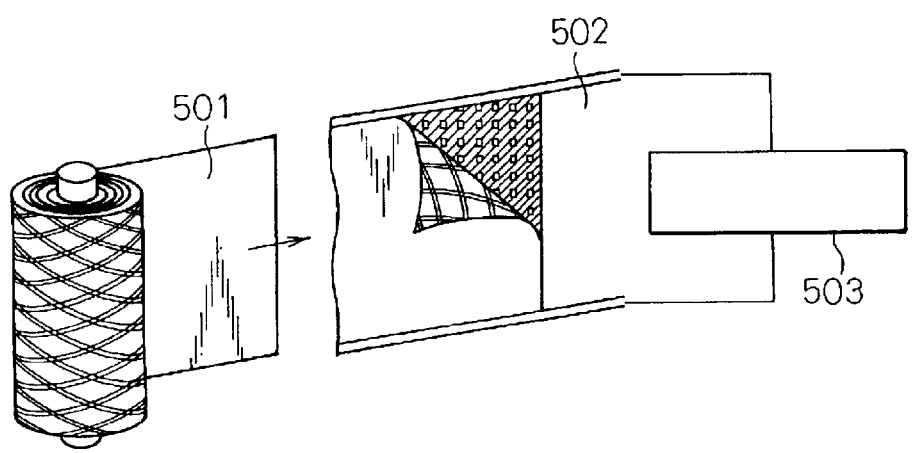
FIG. 9 is a schematic view of an electronic wallpaper system as an embodiment of the sheet-like display device according to the present invention.

Application Example:

FIG. 9 shows an outline of the device. The wallpaper portion 501 includes a display element comprising microcapsules sealing therein display particles (electrophoretic particles) and a common electrode, and discrete electrodes, driving/control circuit, power source, etc, are disposed on the wall surface 502. Since the control circuit, etc, is not integrated with the wallpaper portion 501, the wallpaper can be cut and bonded at an arbitrary position, and can operate. In this case, a controller 503 (which may be put on the wall surface 502) separately disposed can input and display signals of an arbitrary display pattern. The power source is necessary only when the display pattern is changed, but is not required for keeping the pattern. As the surface is grounded, adhesion of dust due to the electric charge can be prevented, and contamination can be prevented. To protect the common electrode (not shown) of the wallpaper portion 501, an electrically conductive resin is thinly coated to the surface. A pattern suitable for the season or the object of use of a room can be selected and displayed. It is further possible to display not only the pattern of wallpaper but also a painting and a photograph and to display a window frame to arbitrarily display an outdoor scene. Naturally, this system can be applied to the ceiling, too. When the protective layer is further reinforced to have durability, the system can be used also as the outer wall surface. Colors can be changed and decoration such as the Christmas decoration can be displayed. When a common electrode of the display element is disposed on the wall surface side and is connected to the control means, input means such as a writing stick, having a driving circuit, can change the pattern from the wallpaper surface.

(5) Large-screen television fitted to wall and others:

Form Example:

display size of least dozens of inches; the television can be rolled and removed.

Examples of Functions:

reception (selection of station, control), display, sound output, etc.

Example of Constituent Elements:

display portion, sound output (speaker), power source, communication (reception), selector switch, etc.

Application Example:

The television can be carried around to an arbitrary position, and fitted to display. Since it is light in weight, it can be fitted to the ceiling for display.

(6) Electronic conference documents that can be rolled:

Form Example:

A4 to A3 size (foldable to A4 size); as thin as paper; can be made cylindrical.

Examples of Functions:

reception/transmission, data memory, screen switching, enlargement/reduction, input, etc.

Examples of Constituent Elements:

display portion, driving circuit, power source, communication (transmission/reception) circuit, control circuit, memory, input means, etc.

Figure 10:
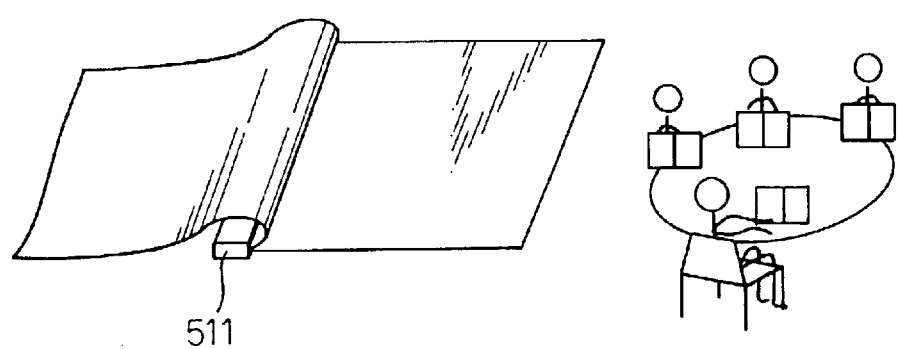
FIG. 10 is a schematic view of an electronic conference document as an embodiment of the sheet-like display device according to the present invention.

Application Example:

FIG. 10 shows an outline of the device. A plurality of sheets is bundled and inserted into a binding member 511 including a power source, a driving circuit, a control circuit, a memory, communication function means, etc, to accomplish a page turn-over function. This electronic conference document can receive and store the information through a communication device, can call and display a display screen, whenever necessary, and can be taken up with the binding member 511 as the center. It has similar functions and construction as those of the electronic books and electronic catalogs described above. In addition, each document can be removed from the binding member (front and back covers) 511, can be taken out one by one for comparison, and can be displayed on a desk like paper.

(7) Display device of electronic conference system capable of conducting conference with realism Form Example:

several meters in length; having rigidity such that the device can be loosely curved.

Examples of Functions:

reception/transmission, data memory, screen switching, input, audio/video input, etc.

Examples of Constituent Elements:

display portion, driving circuit, power source, communication (transmission/reception) circuit, control circuit, memory, input means, audio input/output means, video input means, etc.

Figure 11:
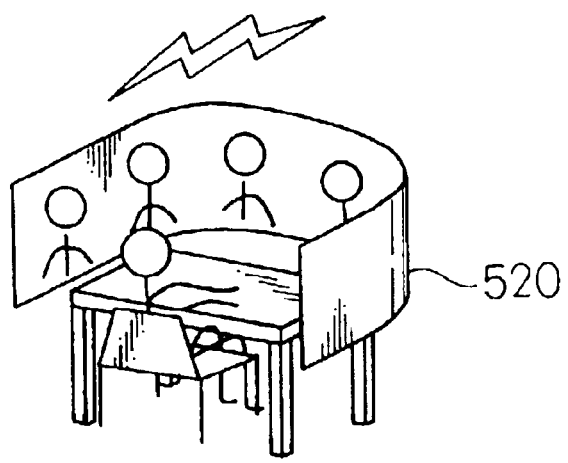
FIG. 11 is a schematic view of a display device for the electronic conference system as an embodiment of the sheet-like display device according to the present invention.

Application Example:

FIG. 11 shows an outline of the electronic conference system display device 520. Since the display device 520 can display while encompassing all participants, it can improve realism. The display device is vertically planted on the desk to cover almost the full surface of the visual field. The video input means displays a plurality of members on the large screen, and can display the positional relationship of the counter-parts. Associated documents can be distributed through communication, and discussion can also be done.

(8) Sheet-like display device that can be accommodated in writing instrument such as pen or can be compactly folded:

(8-1) Display Device Accommodated in Pen, etc:

Form Example:

about A6 in size; foldable.

Example of Functions:

reception, data memory, screen switching, etc.

Examples of Constituent Elements:

display portion, driving circuit, power source, communication (transmission/reception) circuit, control circuit, memory, input means, etc.

Figure 12:
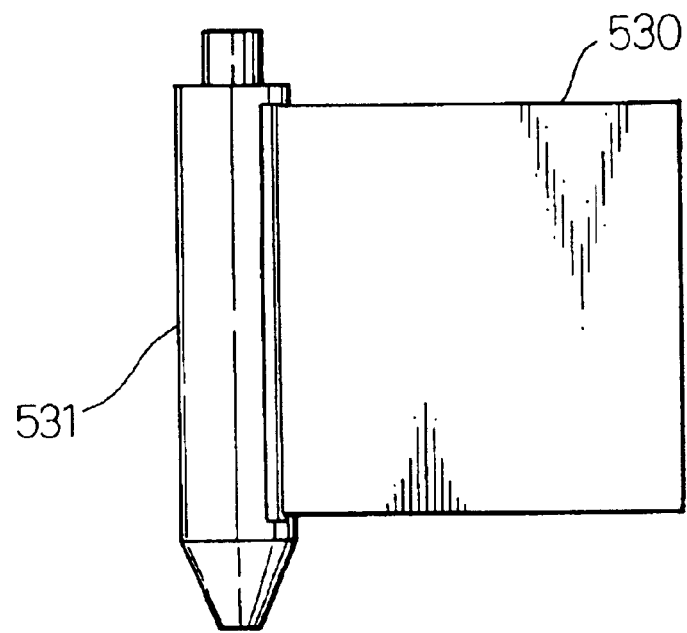
FIG. 12 is a schematic view of a display device capable of being stored in a pen as an embodiment of the sheet-like display device according to the present invention.

Application Example:

FIG. 12 shows an example of the display device 53 that is wound inside a pen 531. This display device 530 can be wound inside the pen 513 and is appropriately pulled out and used. The display device is connected at the end thereof with the driving circuit, the communication circuit, the control circuit, the power source (not shown), etc, disposed inside the pen 531, receives the information by using these members through an antenna (not shown) provided to the pen 531, and displays and updates the information. A switch (not shown) provided to the main body of the pen 351 or a touch key (not shown) provided to the display screen of the display device 530 is operated to control the screen. Since the display device 530 is used while it is pulled out, it preferably has rigidity such as a film sheet for easy handling.

(8-2) Display Device Compactly Foldable:

Form Example:

A4 to A3 size when expanded and foldable to about A6 size.

Example of Functions:

reception, data memory, screen switching, etc.

Examples of Constituent Elements:

display portion, driving circuit, power source, communication (reception) circuit, control circuit, memory, input means, etc.

Application Example:

This display device has the same outline as that of the electronic newspaper (1-1). The driving circuit, the communication circuit, the control circuit and the power source are formed within the range of the A6 size as the last folding size. The display device is folded like paper or is rounded and stored into a pocket. The display device is taken out and expanded, whenever necessary, and can confirm the content.

(9) Sheet-like display device that can be perused on desk, can be bundled, can store without power, and can erase and re-write data whenever necessary.

Form Example:

A4 to A3 size; thickness and flexibility to such an extent that the display device can be bent or folded.

Example of Functions:

reception/transmission, data memory, screen switching, enlargement/reduction, input, etc.

Examples of Constituent Elements:

display portion, driving circuit, power source, communication (transmission/reception) circuit, control circuit, memory, input means, etc.

Figure 13A:
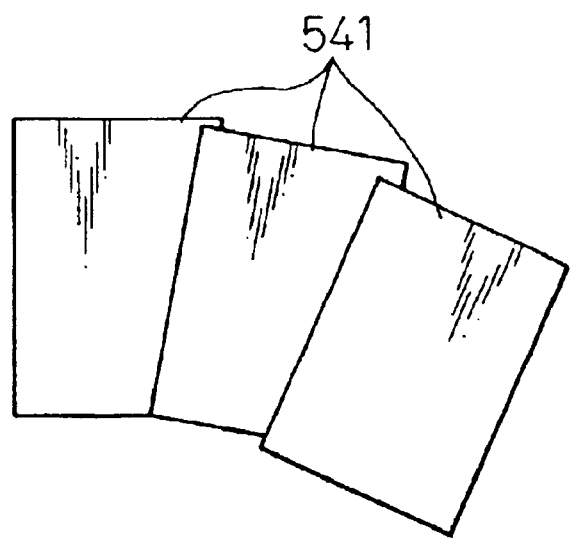
FIGS. 13A and 13B are schematic views of a paper-like display device as an embodiment of the sheet-like display device according to the present invention.
Figure 13B:
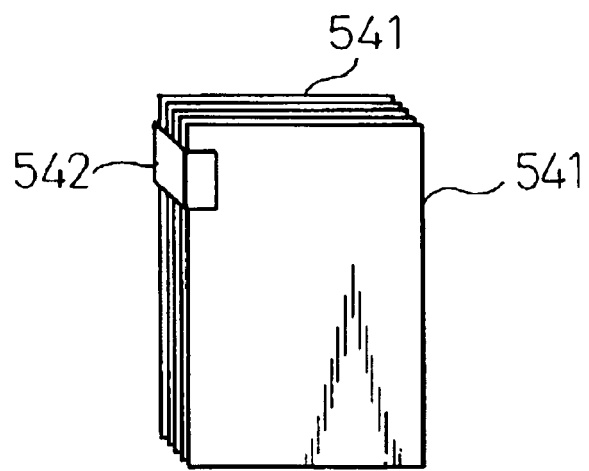

FIG. 13A shows an outline of the device. Because the display device can keep the display information, only the display portion 541 can be used like paper while it is cut off from the driving portion. The display device can be bundled by using a clip 542 as shown in FIG. 13B. To update the display, this display device is fitted to the bundling member (back cover) (not shown) with the built-in control circuit, etc, as explained with reference to the electronic conference document (6).

(10) Hanging posters in buses and trams, electronic poster, hanging curtain ads, POP ads, etc:

Form Example:

At least A3 in size; flexibility to permit folding; as thin as paper.

Example of Functions:

reception/transmission, data memory, screen switching, input, etc.

Examples of Constituent Elements:

display portion, driving circuit, power source, communication (transmission/reception) circuit, control circuit, memory, input means, etc.

Application Example:

In the system such as the hanging posters, the system is connected to a portable information terminal of an individual by communication means, and acquisition of information, ordering of merchandize and settlement can be made besides automatic updating of the information by communication. In the case of the electronic poster, the POP ad and the hanging curtain ad, the information of the sale, time service, etc, can be updated on the real time basis in accordance with the season, the day of the week, the time zone, and so forth, to satisfy the change and taste of customers. The ad includes input means capable of displaying and erasing the information, and the order can be directly placed from the poster. Once the hanging curtain ad is fitted, the information can be updated by communication, and the trouble of the exchange of the ad and the danger of putting the ad can be voided.

(11) Electronic tag for foodstuff for display the place of production, recipe, etc:

Form Example:

name card size; sheet-like and somewhat bendable.

Example of Functions:

display, memory, power source, reception, data output, etc.

Examples of Constituent Elements:

display portion, driving circuit, power source, communication (reception) circuit, control circuit, memory, touch key, etc.

Figure 14A:
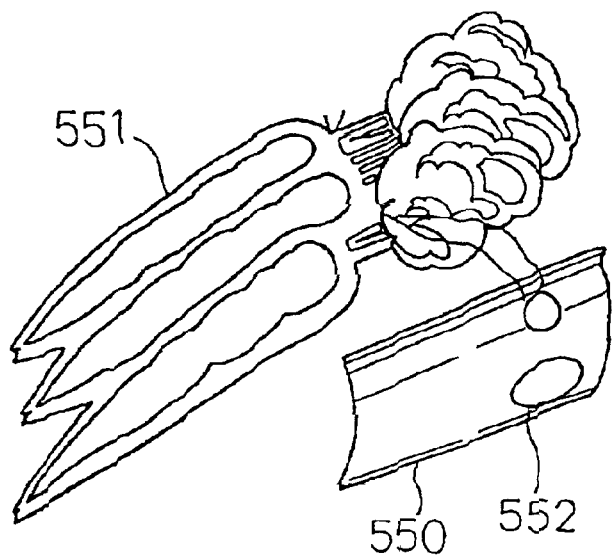
FIGS. 14A and 14B are schematic views of an electronic tag as an embodiment of the sheet-like display device according to the present invention.
Figure 14B:
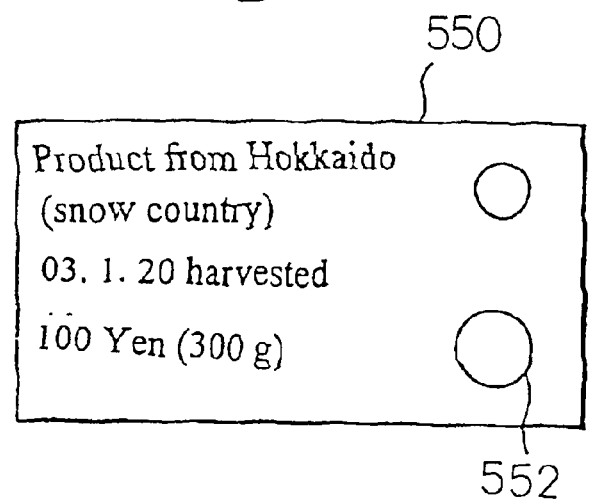

Application Example:

FIGS. 14A and 14B show an outline of the electronic tag 550. Display can be rewritten through communication while the tag 550 is kept attached to the merchandise 551 as shown in FIG. 14A. The merchandize information such as the name of the merchandise, the weight, the price, the place of production, the date of production, the term of appreciation, the grade, etc, and the recipe using the merchandise, other foodstuff necessary for the recipe, etc, can be switched and displayed when buttons 552 on the display screen are operated as shown in FIG. 14B. The information can be as such inputted to the portable information terminal or can be utilized for managing the family finances and stocks. When a purchaser takes the merchandise to the home and inputs the data to a computerized home appliance such as refrigerator, the data can be used for the stock management. The tag after use is returned to the shop and the shop updates the information for reuse.

(12) Automatic account settlement system by electronic tag for finishing settlement when merely passing through gate:

Form Example:

About name card size; sheet-like and somewhat bendable.

Example of Functions:

display of amount, calculation, communication (transmission/reception).

Examples of Constituent Elements:

display portion, driving circuit, power source, communication (transmission/reception) circuit, control circuit, memory, touch key, etc.

Application Example:

A transmission function is added to the electronic tag in (11), and merchandise information is transmitted in response to an access signal from a settlement gate. The transmission content is recorded, and the amount is automatically withdrawn for settlement from the account of a credit card in advance registered. Another sheet-like display device can display the transaction content so that the purchaser can confirm the transaction.

(13) System capable of displaying the prices of merchandises and their total amount and settling through electronic tags when a purchaser puts the merchandises into (or takes them out from) a shopping basket:

Form Example:

about name card size; sheet-like somewhat bendable.

Example of Functions:

display of amount, calculation and communication (reception/transmission).

Examples of Constituent Elements:

display portion, driving circuit, power source, communication (transmission/reception) circuit, control circuit, memory, touch key, etc.

Application Example:

A transmission function is added to the electronic tag (11), and a display device capable of transmission/reception and calculation is put to the shopping basket. When the merchandises are put into the basket (or taken out from the basket), the data is transmitted from the merchandises, and the prices and the total amount are automatically displayed on the display device of the basket. When the purchase of the merchandises becomes definite, the electronic settlement system enables the purchaser to confirm the total amount.

(14) Alarm display medium for raising alarm to passengers only when doors of trams, etc, is open (at the time of getting on and off):

Form Example:

About A4 to A3 size; as thin as paper; capable of being fitted and removed to and from wall surface, etc.

Example of Functions:

communication (reception).

Examples of Constituent Elements:

display portion, driving circuit, power source, communication (reception) circuit, control circuit, memory, etc.

Application Example:

The medium is bonded to a portion near a door of a vehicle or to the door itself, displays general information or ads during driving or is an unnoticeable display. The medium displays the content in accordance with opening/closing of the door and promotes the caution of passengers.

(15) Electronic newspaper and magazines having posters or ads, for displaying and communicating detailed information when a predetermined portion of the ad is touched:

Form Example:

A4 to A3 size (foldable to A4 size); sheet-like somewhat bendable; removable (in the case of poster).

Example of Functions:

reception/transmission, data memory, screen switching, input.

Examples of Constituent Elements:

display portion, driving circuit, power source, communication (transmission/reception) circuit, control circuit, memory, input means, etc.

Application Example:

The system includes a transparent touch sensor on the surface thereof, and hides the touch key in the case of display of the ad. The position of the touch key is displayed at the time of input so that data can be inputted. The system can be connected to a portable information terminal for communication, inputs the information default-stored in the terminal and accepts the request for documents.

(16) Intelligent road/traffic marks:

Form Example:

plate of at least 1 m×1 m.

Example of Functions:

reception/transmission, screen switching

Examples of Constituent Elements:

display portion, driving circuit, power source, communication (transmission/reception) circuit, control circuit, memory, etc.

Application Example:

FIG. 15 shows an example of the road sign. The road sign displays and updates on a real time basis through communication the road information inclusive of jam information, detour information, booking condition of hotels and restaurants, and so forth. The road signal needs less display energy and does not need energy for keeping display. In the case of the traffic mark, it can automatically update timewise the regulation information. When a road monitor function is added to the road sign and the traffic mark, they can automatically transmit jam information, etc.

(17) Intelligent electronic ticket (railway tickets, etc) and pass:

Example of Form:

name card or pass size; sheet form having certain rigidity.

Example of Functions:

reception/transmission, data memory, screen switching, input, alarm, time display.

Examples of Constituent Elements:

display portion, driving circuit, power source, communication (transmission/reception) circuit, control circuit, memory, touch key, etc.

Figure 16A:
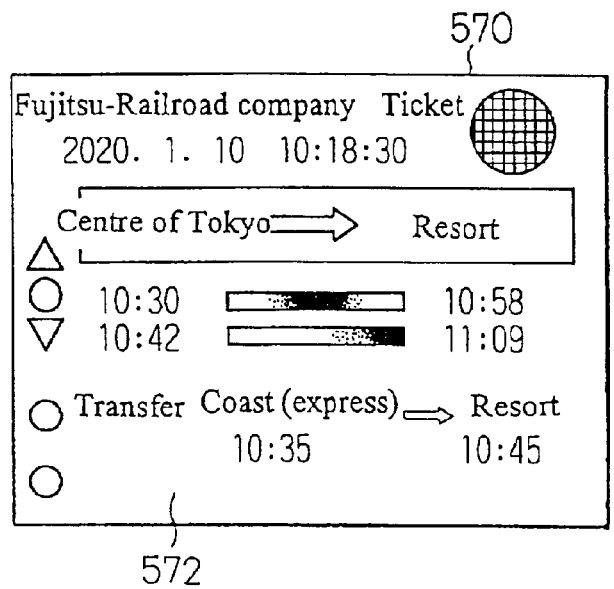
FIGS. 16A and 16B are schematic views of an electronic ticket as an embodiment of the sheet-like display device according to the present invention.
Figure 16B:
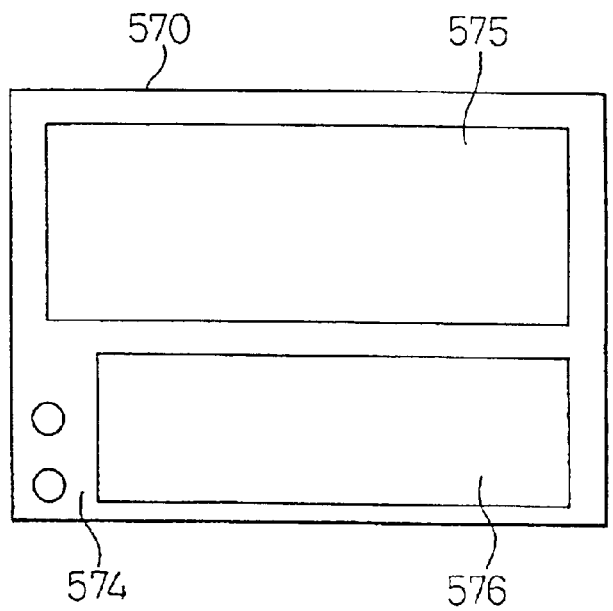

Application Example:

FIGS. 16A and 16B show an example of the electronic ticket 570. When a passenger selects the destination at the time of purchase, the surface 572 shown in FIG. 16A preferentially provides the information useful to a passenger besides the display of the zone and the fare that are originally and not always necessary for the passenger. Examination of the ticket at a gate after the purchase of the ticket is completed through communication between the gate and the ticket. The electronic ticket has also a time display function and can display the operation information such as the departure time of trains after the present time, a guide to the platform, the arrival time at the destination, and various other operation information provided by the communication function of the ticket such as the congestion information of each car. It can also display the change information. The information may be displayed either simultaneously or by switching the screen through switch keys such as the touch key. When the car approaches the destination station, the ticket detects it by a signal substituting the inter-car announcement or a transmission signal from intermediate stations and notifies the passengers of that effect through an alarm (light, sound, vibration, etc). Therefore, the inter-car announcement becomes unnecessary, and a pleasant environment can be provided. Since the alarm is employed, "user friendliness" to the handicapped is improved. Display can be made on the back 574 shown in FIG. 16B, and guide display 575 along the line and ad display 576 can also be made. The kind of the information can be varied with the object of travel such as commutation and sightseeing, and passengers with the pass can register and display their desired information. Examination of the ticket at the exit gate can be made through communication with the gate in the same way as entry. To reliably recover the tickets, it is possible to devise a system that inserts the tickets into the gate for communication.

(18) Display device bonded to dashboard, etc, for displaying alarm and counter-measure information only in the case of emergency, the existence of which cannot be recognized at normal times:

Form Example:

up to about A4 size; as thin as paper and removable.

Example of Functions:

communication (reception)

Examples of Constituent Elements:

display portion, driving circuit, power source, communication (reception) circuit, control circuit, memory, etc.

Application Example:

This display device basically accomplishes substantially the same function as that of the seal-like alarm display medium (14). Its color is normally the same as the color of the dashboard and does not deteriorate the interior appearance of the car. Only when any trouble occurs, the display device displays optimum counter-measures and cautions in accordance with the trouble in response to the display signals. In this way, oversight of the display can be prevented, recognition and apprehension of the information can be improved, and quick and suitable counter-measures can be taken.

(19) Electronic text:

Form Example:

A4 to A3 size (foldable to A4 size); as thin as paper; a plurality of texts can be bundled or folded.

Example of Functions:

transmission/reception, screen switching, enlargement/reduction, input, retrieval Examples of Constituent Elements:

display portion, driving circuit, power source, communication (transmission/reception) circuit, control circuit, memory, input means, etc.

Application Example:

The basic construction of this electronic text is the same as that of the electronic catalog (1-3) and the communication tool (3). This text comprises a plurality of sheet-like display elements each capable of displaying information necessary for learning through communication and retrieving and displaying the detailed information associated with the learning content through the Internet. Besides the input means such as a touch board that can be displayed and erased on the display screen in accordance with the application of the text, the electronic text has a hand-writing input function in the same way as the electronic conference documents (6) and the notebook function capable of storing the input information.

(20) Display device capable of displaying like paper, for use in global education system:

Example of Form:

at least A4 size.

Example of Functions:

transmission/reception, data memory, screen switching, enlargement/reduction, input, retrieval, video input, etc.

Examples of Constituent Elements:

display portion, driving circuit, power source, communication (transmission/reception) circuit, control circuit, memory, input means, video input means, etc.

Figure 17:
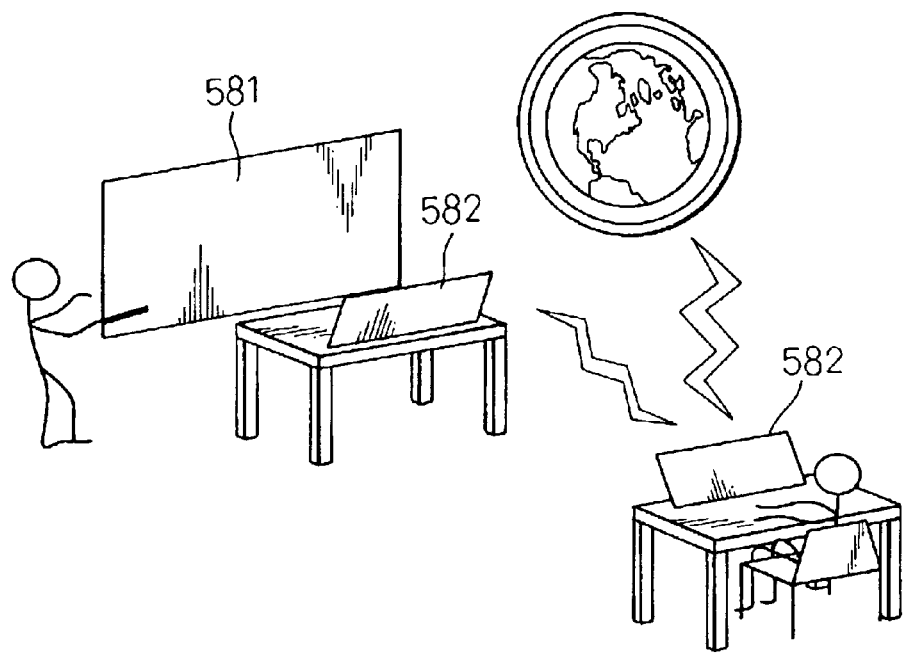
FIG. 17 is a schematic view of a display device for a global education system as an embodiment of the sheet-like display device according to the present invention.

Application Example:

FIG. 17 shows an example of the display device for the global education system. Here, the global education system includes an electronic blackboard 581 similar to the display device of the electronic conference system (7) and a display device 582 similar to the electronic text (19). This system can transmit, display and record the content a teacher puts on the electronic blackboard 581 while keeping linkage with schools in the world. The system can also assist individual teaching between the teacher and the student. An audio input/output function and a video input function may be added to this system.

Next, a structural example of the sheet-like display device according to the invention that uses the electrically conductive resin layer as a common electrode positioned on the display surface side will be explained with reference to FIG. 18.

Figure 18:
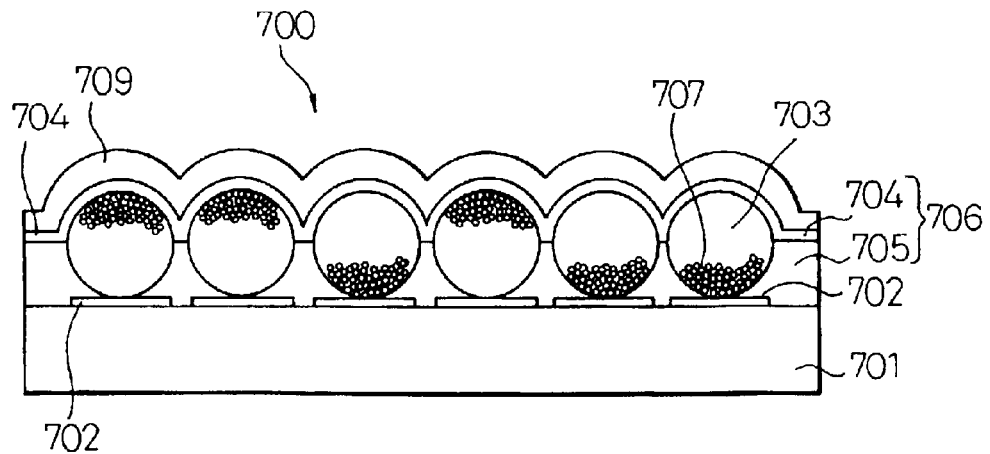
FIG. 18 is a cross-sectional view of a sheet-like display device according to the present invention wherein a display layer and electrodes have an integral structure.

As shown in FIG. 18, the sheet-like display device 700 comprises discrete electrodes 702 formed on a substrate 701, microcapsules 703, sealing therein electrophoretic particles, so positioned as to correspond to the discrete electrodes 702 and fixed to the substrate 701 through an adhesive layer 705, and a common electrode 704 formed of the electrically conductive organic compound of the invention and covering a display layer 706 constituted by these microcapsules and adhesive layer 705. The discrete electrode 702 and the common electrode 704 together form a pair of opposing electrodes. The common electrode 704 positioned on the display surface side of the display device 700 is normally transparent.

The display device 700 that displays images when a voltage difference is applied between the opposing electrodes 702 and 704 and optical reflection or optical absorption of the microcapsules changes can be converted to a sheet-like display device having a thickness and luster analogous to that of paper as the electrode 704 on the display surface side is laminated and integrated with the display layer 706 into a unitary structure as shown in FIG. 2. To integrate the common electrode layer 704 with the display layer 706, it is possible to use a method that directly applies the electrically conductive resin material to the display layer 706 and a method that laminates a film that is prepared in advance (not shown) with the display layer 706.

Figure 19:
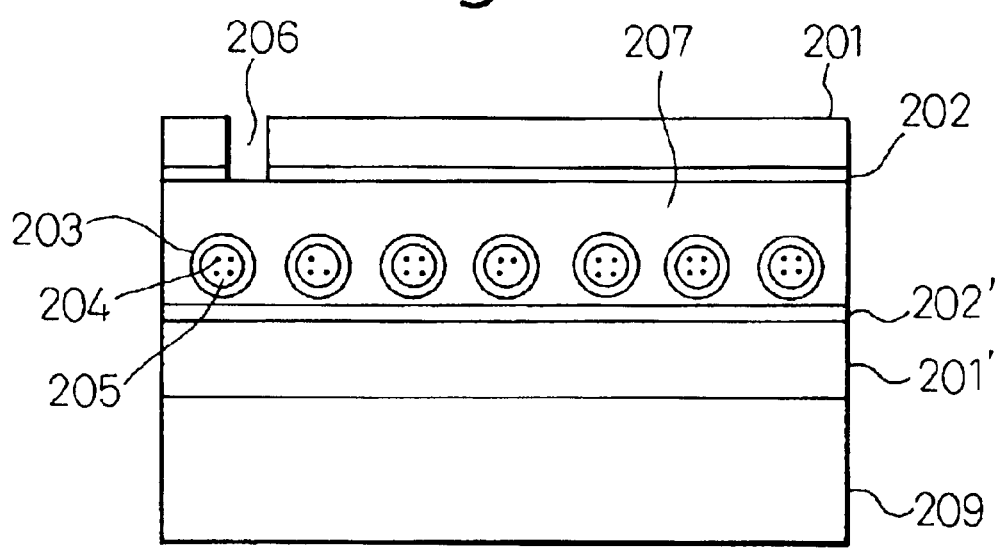
FIG. 19 is a cross-sectional view of a sheet-like display device according to another embodiment of the present invention.

A sheet-like display device having another construction and its production example will be explained with reference to FIG. 19.

The illustrated sheet-like display device comprises a display portion and a power source portion. The display portion has a construction in which a large number of microcapsules 203 encapsulating in advance a dispersion system 205, that contains electrophoretic particles 204 dispersed in a dispersion medium, by a microcapsule encapsulation method are interposed between transparent electrodes 202 and 202 formed on the opposing surfaces (ITO vacuum deposition surfaces) of transparent members 201 and 201' formed of a pair of ITO vacuum deposition PET (polyethylene terephthalate) films. An aluminum vacuum deposition layer is formed on the side opposite to the ITO vacuum deposition surface of one 201' of the transparent members. The transparent electrodes 201 and 201' use the electrically conductive organic compound according to the invention.

Examples of the electrophoretic particles 204 of the dispersion system 205 encapsulated in the microcapsules 203 include ordinary colloidal particles, metal fine particles, organic or inorganic dyes, organic or inorganic pigments, ceramic or glass fine particles, and fine particles of suitable resins and rubbers. Further, these particles can be used in combination, without causing any problem.

Examples of the dispersion medium of the dispersion medium 205 include water or aqueous solutions of inorganic or organic salts, alcohols, amines, saturated or unsaturated hydrocarbons, halogenated hydrocarbons, natural fats, mineral oil and synthetic oil.

Such a dispersion system 205 may contain an inorganic or organic electrolyte, a surfactant or its salt, a charge controller of particles of a resin material or rubber, a dispersant mainly consisting of a surfactant, a lubricant, a stabilizer, and so forth, whenever necessary.

This dispersion system 205 is sufficiently mixed by a roll mill, a ball mill, etc, and is converted to the microcapsules by an interfacial polymerization method or a coacervation method. Preferably, the film forming the outer periphery of the microcapsules 203 and the dispersion system 205 have equivalent volume resistivity.

The microcapsules 203 are arranged on the surface of one 202' of the transparent electrode by using means such as screen printing, and are sealed between the electrodes in combination with the other transparent electrode 202. The sealing process of the dispersion system 205 using the microcapsules 203 between both electrodes 202 and 202' can be made by the method described above and also by a method that injects a predetermined amount of microcapsules 203 through a sealing hole (not shown) communicating with both electrodes.

From the practical aspect, it is preferred to fill a material 207 which is chemically stable to the microcapsules 203 and whose refractive index and volume resistivity are analogous to those of the microcapsules 203 in the space between the microcapsules 203 and between the electrodes 202 and 203 and the microcapsules 203 through an injection hole 206 as shown in the drawing.

Next, production of a cell 209 as the power source portion will be explained.

First, 10 parts by mass of pyrrole is added to 90 parts by mass of acetonitrile. Further, 5 parts by mass of lithium tetrafluoroborate is added and the mixture is uniformly mixed. Next, 50 parts by mass of lithium cobalt is added. After being gently stirred, the mixture is left standing for 10 minutes. Next, lithium cobalt is separated by filtration, washed with acetonitrile and dried at 80° C. for 10 minutes. 3 parts by mass of acetylene black is added to 100 parts by mass of the resulting powder and is mixed by using a mill. Thereafter, 50 parts by mass of 10% N-methylpuyrrolidone solution of polyvinylidene fluoride is mixed and kneaded, is then applied to the vacuum deposition aluminum surface of the transparent member 201' of the display portion to a thickness of 150 μm, and is dried at 120° C. for 30 minutes to give a positive plate foil.

The solid electrolyte uses acryl-modified polyethylene oxide. 100 parts by mass of a 10:1 mixture of terminal acryl-modified polyethylene oxide and both terminal acryl-modified polyethylene oxide and 100 parts by mass of propylene carbonate containing 1M lithium tetrafluoroborate are mixed, and 1 part by mass of benzoyl peroxide is added to give a reaction polymerization solution.

A non-woven fabric having a thickness of 40 μm is put on the positive plate, and the reaction polymerization solution of the solid electrolyte described above is spread at a film thickness of 100 μm. Next, ultraviolet rays are irradiated from a ultra-high voltage mercury lamp (1 mW/cm$^2$) for one minute to polymerize the solution and to form a gel-like solid electrolyte film.

On the other hand, the negative plate is produced in the following manner. First, 1 part by mass of a 10% N-methylpyrolidone solution of polyvinylidene fluoride is mixed and kneaded with 1 part by mass of graphite type carbon. The mixture is applied to a negative plate current collector (10 μm-thick copper foil) at a thickness of 100 μm, and is dried at 120° C. for 30 minutes. This negative plate is put on the semi-cell having the electrolyte described above and is converted to a cell by applying a pressure of 2 kg/cm$^2$ (196 kPa). The positive and negative voltages can be obtained through the current collectors supporting thereon the respective electrode active materials.

In this manner, a sheet-like display device comprising the display element and the secondary cell integrated with each other and having a display function can be obtained.

EXAMPLES

The present invention will be further explained with reference to examples thereof. It is to be noted, however, that the invention is in no way limited to the following examples.

Example 1

A plastic sheet consisting of polyether sulfone was prepared as a substrate. After gold was sputtered to form a gate electrode, cyanoethylated pullulan dissolved in acetone was applied. The solvent was dried to give an insulation layer having a film thickness of 150 nm. A solution of a polyimide precursor was applied onto this insulation layer and heat-treatment was carried out at 140° C. for one hour. Rubbing treatment was then carried out to form a polyimide orientation film. Next, a source electrode and a drain electrode were formed on this polyimide orientation film with an electrode distance, that is, a channel length, of 5 μm. A polythiophene derivative (see the following formula) containing polysilane groups in the polythiophene main chain and having a weight average molecular weight of about 30,000 was dissolved in toluene and was heated. The solution so prepared was spin-coated to the plastic substrate having the electrodes formed thereon in the manner described above. The solvent was gradually dried, and a channel layer having a film thickness of 100 nm was obtained.

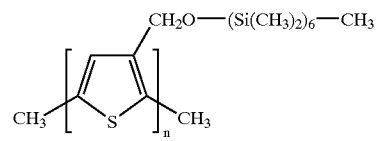

Note that the polythiophene derivative used in this example was synthesized by mixing a polymer containing 3-thiophene methanol as a main structure, terminal chlorinated oligosilane hexamer and pyridine, and stirring the mixture in toluene for five hours.

Subsequently, field-effect mobility of the electrically conductive organic compound was calculated from the relationship of the drain voltage, the gate voltage and the drain current for the organic thin film transistor fabricated as described above. Field-effect mobility was maximum $\mu=0.03$ cm$^2$/Vs at room temperature.

Example 2

The procedures of Example 1 given above were repeated but in this example, a polythiophene derivative (see the following formula) having a weight average molecular weight of about 60,000 and containing polysilane groups, introduced into the polythiophene main chain, different from that of Example 1, was used to form the channel layer.

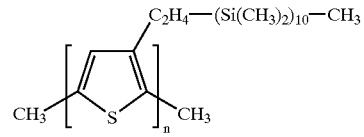

A channel layer having a film thickness of 100 nm was obtained.

Subsequently, field-effect mobility of the electrically conductive organic compound was calculated from the relationship of the drain voltage, the gate voltage and the drain current for the organic thin film transistor fabricated as described above. Field-effect mobility was maximum $\mu=0.025$ cm$^2$/Vs at room temperature.

Example 3

The procedures of Example 1 given above were repeated but in this example, a polythiophene derivative (see the following formula) having a different structure from the polythiophene derivative of Example 1 and a weight average molecular weight of about 40,000 was used to form the channel layer.

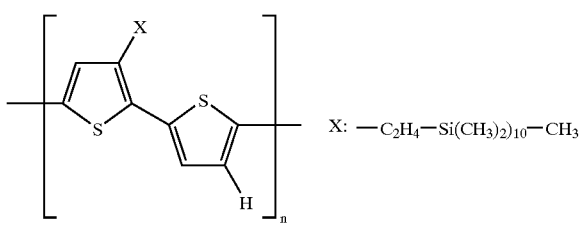 

A channel layer having a film thickness of 100 nm was obtained.

Subsequently, field-effect mobility of the electrically conductive organic compound was calculated from the relationship of the drain voltage, the gate voltage and the drain current for the organic thin film transistor fabricated as described above. Field-effect mobility was maximum $\mu=0.01$ cm$^2$/Vs at room temperature.

Comparative Example 1

The procedures of Example 1 given above were repeated but in this example, poly(3-hexylthiophene) having a weight average molecular weight of about 80,000 was used for comparison in place of the polythiophene derivative containing the polysilane groups introduced into the polythiophene main chain. A channel layer having a film thickness of 100 nm was obtained.

Subsequently, field-effect mobility of the electrically conductive organic compound was calculated from the relationship of the drain voltage, the gate voltage and the drain current for the organic thin film transistor fabricated as described above. Field-effect mobility was maximum $\mu=0.00005$ cm$^2$/Vs at room temperature.

According to the present invention, since the main chain structure has the π conjugated system structure, and the side chain having both refractive index anisotropy and σ conjugated system electrical conductivity was introduced into the main chain structure, refractive index anisotropy of the side chain (liquid crystal property) can improve the molecular orientation property. Because of the contribution of the σ conjugated system side chain to electrical conductivity, mobility that is about two figures higher than that of the prior art can be achieved as the solution system and eventually, an operation speed of the electronic elements, e.g. field effect transistors can be improved.

As the functional groups that can be solubilized in the solvent are introduced, the electrically conductive organic compound according to the invention can easily form a thin film by a film formation method from a solution, such as a coating method and a printing method. Therefore, the fabrication process of the electronic elements such as the field effect transistors can be simplified and the cost of production can be lowered.

Since the present invention can use a flexible plastic substrate, the invention can easily provide the electronic paper that has drawn increasing attention in recent years.

What is claimed is:

1. An electrically conductive organic compound in which a side chain portion simultaneously exhibiting refractive index anisotropy and σ conjugated system electrical conductivity is bonded to a main chain portion exhibiting π conjugated system electrical conductivity, wherein the side chain portion is a silane structure represented by the following general formula (III):

where R may be the same or different and each represents a lower alkyl group, and m is an integer of 5 to 20.

2. An electrically conductive organic compound according to claim 1, wherein the main chain portion is constituted by a cyclic π conjugated system compound.

3. An electrically conductive organic compound according to claim 1 or 2, wherein the main chain portion has a repeating unit represented by the following general formula (I):

where Z represents atoms necessary for completing a five-member ring along with a sulfur atom, X represents at least one side chain portion as claimed in claim 1 to be bonded to the five-member ring along and n represents an integer of 1 to 100.

4. An electrically conductive organic compound according to claim 3, wherein the main chain portion has a repeating unit represented by the following general formula (I-1):

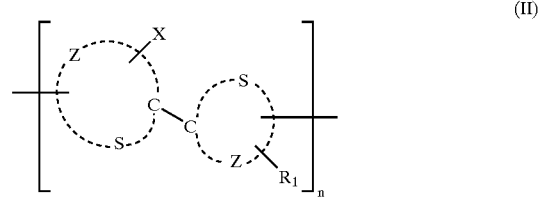

where each of X and n has the same meaning as defined in claim 3.

5. An electrically conductive organic compound according to claim 1 or 2, wherein the main chain portion has a repeating unit represented by the following general formula (II):

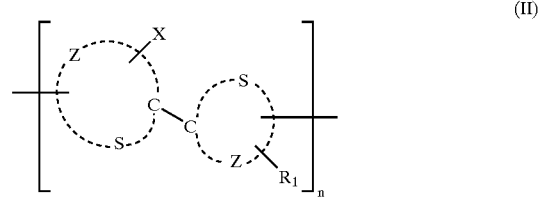

where Z represents atoms necessary for completing a five-member ring along with a sulfur atom, X represents at least one side chain portion as claimed in claim 1 to be bonded to the five-member ring, R$_1$ represents a hydrogen atom or at least one substitution group, and n represents an integer of 1 to 100.

6. An electrically conductive organic compound according to claim 5, wherein the main chain portion has a repeating unit represented by the following general formula (II-1):

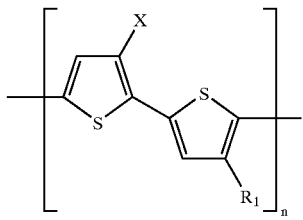

where each of X, $R_1$ and n has the same meaning as defined in claim 5.

7. An electrically conductive organic compound according to claim 1 or 2, wherein the side chain portion having the refractive index anisotropy property exhibits a smectic liquid crystal property.

8. An electrically conductive organic compound according to claim 1 or 2, wherein the side chain portion having the refractive index anisotropy property exhibits a nematic liquid crystal property.

9. An electrically conductive organic compound according to claim 1 or 2, which is represented by the following general formula (IV):

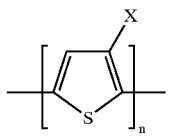

where X: —$R_2$—$(Si(CH_3)_2)_m$—$CH_3$,
$R_2$: —$CH_2$—O—, —$CH_2$—, —$C_2H_4$— or —O—$CH_2$—,
m=5 to 20, and
n=1 to 100.

10. An electrically conductive organic compound according to claim 1 or 2, which is represented by the following general formula (V):

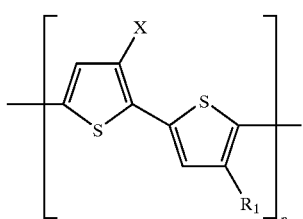

where X: —$R_2$—$(Si(CH_3)_2)_m$—$CH_3$,
$R_1$: H, $CH_3$ or $C_2H_5$,
$R_2$: —$CH_2$—O—, —$CH_2$—, —$C_2H_4$— or —O—$CH_2$—,
m=5 to 20, and
n=1 to 100.

11. An electronic device comprising a constituent element formed using an electrically conductive organic compound in which a side chain portion simultaneously exhibiting refractive index anisotropy and a conjugated system electrical conductivity is bonded to a main chain portion exhibiting π conjugated system electrical conductivity, wherein the side chain portion of said organic compound is a silane structure represented by the following general formula (III):

where R may be the same or different and each represents a lower alkyl group, and m is an integer of 5 to 20.

12. An electronic device according to claim 11, wherein the main chain portion of said organic compound is constituted by a cyclic 90 conjugated compound.

13. An electronic device according to claim 11 or 12, wherein the main chain portion of said organic compound has a repeating unit represented by the following general formula (I):

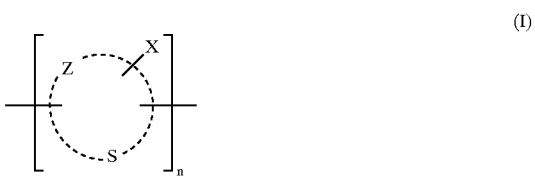

where Z represents atoms necessary for completing a five-member ring along with a sulfur atom, X represents at least one side chain portion as claimed in claim 11 to be bonded to the five-member ring and n represents an integer of 1 to 100.

14. An electronic device according to claim 13, wherein the main chain portion of said organic compound has a repeating unit represented by the following general formula (I-1):

where each of X and n has the same meaning as defined in claim 13.

15. An electronic device according to claim 11 or 12, wherein the main chain portion of said organic compound has a repeating unit represented by the following general formula (II):

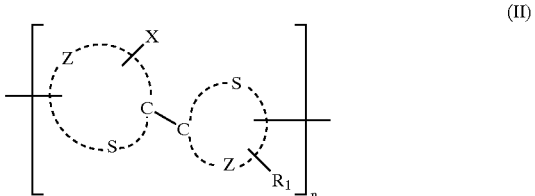

where Z represents atoms necessary for completing a five-member ring along with a sulfur atom, X represents at least one side chain portion as claimed in claim 11 to be bonded to the five-member ring, $R_1$ represents a hydrogen atom or at least one substitution group, and n represents an integer of 1 to 100.

16. An electronic device according to claim 15, wherein the main chain portion of said organic compound has a repeating unit represented by the following general formula (II-1):

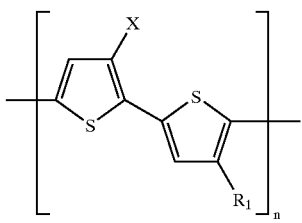

(II-1)

where each of X, $R_1$ and n has the same meaning as defined in claim 15.

17. An electronic device according to claim 11 or 12, wherein the side chain portion having the refractive index anisotropy property of said organic compound exhibits a smectic liquid crystal property.

18. An electronic device according to claim 11 or 12, wherein the side chain portion having the refractive index anisotropy property of said organic compound exhibits a nematic liquid crystal property.

19. An electronic device according to claim 11 or 12, wherein said organic compound is represented by the following general formula (IV):

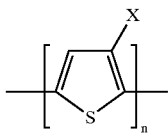

(IV)

where X: —$R_2$—(Si(CH$_3$)$_2$)$_m$—CH$_3$, $R_2$: —CH$_2$—O—, —CH$_2$—, —C$_2$H$_4$— or —O—CH$_2$—, m=5 to 20, and n=1 to 100.

20. An electronic device according to claim 11 or 12, wherein said organic compound is represented by the following general formula (V):

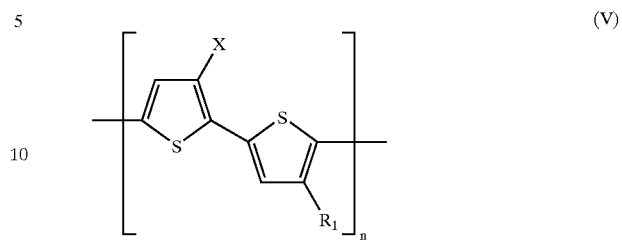

(V)

where X: —$R_2$—(Si(CH$_3$)$_2$)$_m$—CH$_3$, $R_1$: H, CH$_3$ or C$_2$H$_5$, $R_2$; —CH$_2$—O—, —CH$_2$—, —C$_2$H$_4$— or —O—CH$_2$—, m=5 to 20, and n=1 to 100.

21. An electronic device according to claim 11 or 12, which is in the form of an organic thin film transistor comprising a gate electrode, a gate insulator, a gate insulation film, a source electrode, a drain electrode and a channel layer on a substrate, and wherein the channel layer is formed of said electrically conductive organic compound.

22. An electronic device according to claim 21, which further comprises an orientation film formed from polyimide on the gate insulation layer.

23. An electronic device according to claim 21, wherein the substrate is formed from a plastic material.

24. An electronic device according to claim 11 or 12, wherein the electrically conductive organic compound is dissolved in a solvent to form the constituent element.

25. An electronic device according to claim 24, wherein a solution of the electrically conductive organic compound is applied and cured to form the constituent element.

26. An electronic device according to claim 24, wherein a solution of the electrically conductive organic compound is printed and cured to form the constituent element.

27. An electronic device according to claim 11 or 12, which has flexibility and is foldable.

28. An electronic device according to claim 11 or 12, which is in the form of an electronic paper.

* * * * *